(12) United States Patent
Yamaoka et al.

(10) Patent No.: US 9,472,306 B2
(45) Date of Patent: Oct. 18, 2016

(54) SEMICONDUCTOR DEVICE AND ITS QUALITY MANAGEMENT METHOD

(71) Applicant: Hitachi, Ltd., Tokyo (JP)

(72) Inventors: Masanao Yamaoka, Tokyo (JP); Goichi Ono, Tokyo (JP); Chihiro Yoshimura, Tokyo (JP); Masato Hayashi, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 14/644,906

(22) Filed: Mar. 11, 2015

(65) Prior Publication Data

US 2016/0064099 A1    Mar. 3, 2016

(30) Foreign Application Priority Data

Aug. 29, 2014 (JP) ................. 2014-176262

(51) Int. Cl.
| | | |
|---|---|---|
| *G06F 17/50* | (2006.01) | |
| *G11C 29/08* | (2006.01) | |
| *G11C 29/00* | (2006.01) | |
| *G06N 7/00* | (2006.01) | |
| *G06N 99/00* | (2010.01) | |

(52) U.S. Cl.
CPC ............ *G11C 29/08* (2013.01); *G06N 7/005* (2013.01); *G11C 29/76* (2013.01); *G06N 99/002* (2013.01)

(58) Field of Classification Search
CPC .......... G06F 17/5009; G06F 17/5036; G06F 17/5022; G06F 17/5068; G06F 2217/12; G06F 19/3437; G06F 17/5081; G06F 17/5018; G06F 17/5045; G06F 17/5072; G06F 2217/84; G06F 19/12; G06F 2217/16; G06F 2217/82; G06F 2217/78; H01L 21/76898; H01L 21/823807; H01L 27/0207
USPC ................................ 716/100–108
See application file for complete search history.

(56) References Cited

U.S. PATENT DOCUMENTS

| | | | | |
|---|---|---|---|---|
| 2008/0140378 A1* | 6/2008 | Sarti | ............... | G06F 17/5009 703/14 |
| 2009/0222785 A1* | 9/2009 | Cheng | ............... | G06F 17/5036 716/55 |
| 2010/0153082 A1* | 6/2010 | Newman | ............ | G01N 33/5008 703/11 |
| 2013/0226540 A1* | 8/2013 | Pita | ................. | G06F 17/5009 703/2 |
| 2014/0046626 A1 | 2/2014 | Yamamoto et al. | | |

FOREIGN PATENT DOCUMENTS

| | | |
|---|---|---|
| JP | 2012-217518 A | 11/2012 |
| WO | WO 2012/118064 A1 | 9/2012 |

\* cited by examiner

*Primary Examiner* — Binh Tat
(74) *Attorney, Agent, or Firm* — Foley & Lardner LLP

(57) ABSTRACT

A semiconductor device capable of easily and properly detecting a defective element unit(s) and a quality management method for the semiconductor device are suggested. A semiconducting device simulating interactions between nodes in an interaction model is equipped with a quality management unit for managing the quality of each element unit provided corresponding to each node, wherein the quality management unit executes a specified quality test of each element unit, compares test results of the quality test with pre-given results to be obtained from the quality test, and detects a defective memory cell(s) and a defective element unit(s) based on the comparison results.

10 Claims, 22 Drawing Sheets

32 Spin Unit

⊕ Spin
▭ Interaction Coefficient
☐ External Magnetic Field Coefficient

|  | Spin Value | Coefficient Value | Switching Address | Fail Address |
|---|---|---|---|---|
| Memory Cell Structure | SRAM | SRAM | SRAM | Nonvolatile Memory |
| Memory Cell Size | Large | Small | Small | Small |

Fig.19

|  | Spin Value | Coefficient Value | Switching Address | Fail Address |
|---|---|---|---|---|
| Memory Cell Structure | SRAM | SRAM | SRAM | Nonvolatile Memory |
| Memory Cell Size | Small | Small | Small | Small |

SEMICONDUCTOR DEVICE AND ITS QUALITY MANAGEMENT METHOD

CROSS-REFERENCES TO RELATED APPLICATIONS

This application relates to and claims priority from Japanese Patent Application No 2014-176262, filed on Aug. 29, 2014, the entire disclosure of which is incorporated herein by reference.

BACKGROUND

1. Field of the Invention

The present invention relates to a semiconductor device and quality management method thereof. For example, the present invention is suitable to a semiconductor device and quality management method thereof for simulating interactions between spins in an king model.

2. Description of Related Art

Various physical phenomena and social phenomena can be expressed with interaction models. An interaction model is a model defined by a plurality of nodes constituting the model and interactions between the nodes, and bias for each node if necessary. Various models are suggested in physics and social science, but any of them can be interpreted as one form of interaction models. Furthermore, as an example of characteristics of the interaction model, influences between the nodes are limited to interactions between two nodes (interactions between two bodies). For example, considering dynamics of planets in outer space, it can be interpreted as one type of interaction model as there are interactions by universal gravitation between the nodes which are the planets; however, influences between the planets are not limited to those between two planets and three or more planets influence each other and exhibits complicated behaviors (thereby causing problems such as so-called "three-body problems" or "N-body problems").

In the world of biology, a neural network which models a brain can be listed as an example of the interaction model. The neural network has artificial neurons, which simulate nerve cells, as nodes and there are interactions called synaptic connections between the artificial neurons. Also, a bias may be given to each neuron. Regarding the world of social science, for example, if you think about human communications, you could easily understand that there are nodes called humans and interactions composed of languages and communications. Also, it is easily imaginable that each human has its individual bias. Accordingly, there is a study to try clarifying properties of the human communications by simulating them as an interaction model (for example, Japanese Patent Application Laid-Open (Kokai) Publication No. 2012-217518).

On the other hand, an Ising model can be an example of a representative interaction model in the world of physics. The Ising model is a model of statistical dynamics to explain behaviors of a magnetic substance. The Ising model is defined by spins having two values, that is, +1/−1 (or 0/1 or up/down), an interaction coefficient indicative of an interaction between the spins, and an external magnetic field coefficient for each spin.

Energy of the Ising model at the relevant time can be calculated from a given spin alignment, interaction coefficient and external magnetic field coefficient. An energy function of the Ising model can be generally represented by the following expression.

[Math. 1]

$$E(s) = -\sum_{i<j} J_{i,j}\sigma_i\sigma_j - \sum_i h_i\sigma_i \quad (1)$$

Incidentally, $\sigma_i$ and $\sigma_j$ represent i-th and j-th spin values, respectively; $J_{i,j}$ represents the interaction coefficient between the i-th and j-th spins; $h_i$, represents the external magnetic field coefficient for the i-th spin; and a represents the spin alignment.

A first term of Expression (1) is to calculate energy attributable to the interaction between the spins. Generally, the Ising model is expressed as an undirected graph and does not distinguish between an interaction from the i-th spin to the j-th spin or an interaction from the j-th spin to the i-th spin. Therefore, the first term calculates the influence of the interaction coefficient with respect to a combination of $\sigma_i$ and $\sigma_j$ that satisfy i<j. Also, a second term is to calculate energy attributable to the external magnetic field for each spin.

A ground-state search of the Ising model is an optimization problem to find a spin alignment that minimizes the energy function of the Ising model. It is known that when the range of the interaction coefficient and the external magnetic field coefficient is not limited, finding the ground state of the Ising model whose topology becomes a nonplanar graph is an NP-hard problem.

The ground-state search of the Ising model is used not only to explain behaviors of a magnetic substance which is originally a target of the Ising model, but also for various uses. This can be because the Ising model is the simplest model based on interactions and also has the capability to express various phenomena attributable to interactions. For example, Japanese Patent Application Laid-Open (Kokai) Publication No. 2012-217518 discloses a method for estimating the degree of stress in a group such as a workplace organization by using the ground-state search of the Ising model.

Furthermore, the ground-state search of the Ising model also deals with a maximum cut problem known as an NP-hard graph problem. Such a graph problem is widely applicable to, for example, community detection in social networks and segmentation for image processing. Therefore, any solver that performs the ground-state search of the Ising model can be applied to such various problems.

Since finding the ground state of the Ising model is an NP-hard problem as described above, solving the problem with von Neumann computers is difficult in terms of calculation time. While an algorithm that introduces heuristics to increase the speed is suggested, there is suggested a method of finding the ground state of the Ising model at high speeds, without using the von Neumann computers, by calculation that utilizes physical phenomena more directly, that is, by using analogue computers (for example, WO2012/118064).

Such a device requires alignment corresponding to a problem to be solved. In a case of the Ising model, elements that represent each one of spins and an interaction between the relevant spin and another spin (hereinafter referred to as the "element units") are required corresponding to the number of spins in the Ising model for which the ground state should be searched. For example, with the device disclosed in WO 2012/118064, spins are associated with lasers and, therefore, lasers whose quantity is proportionate to the number of spins are required. In other words, high scalability that enables mounting of numerous element units is required.

In consideration of the above-described circumstances, the ground-state search of the Ising model should preferably be performed with a solid-state component such as a semiconductor device that can be implemented by regularly arranging numerous element units. Particularly, it is desirable that such a solid-state component has an array structure represented by a storage apparatus such as a DRAM (Dynamic Random Access Memory) or an SRAM (Static Random Access Memory) and the element unit has a simple structure to enhance accumulation ability. Therefore, in recent years the applicant of the present application has proceeded development of such semiconductor devices (semiconductor chips).

Meanwhile, in order to construct such a semiconductor device, for example, a semiconductor device capable of searching the ground state of a large-scale Ising model including numerous spins, it is necessary to mount as many element units as the number corresponding to the number of spins on the semiconductor chip. When the semiconductor chip is equipped with numerous element units, probability of defective occurrence in the entire semiconductor device increases according to probability of defective occurrence in individual element units.

Therefore, when constructing such a semiconductor device, there is a demand for the structure and quality management method that are capable of easily and properly detecting defective units and dealing with matters by whatever means to prevent the relevant defective element units from causing adverse effects on other element units. However, at present, the structure and quality management method capable of easily and properly detecting defective element units are not suggested for the above-described semiconductor device.

SUMMARY

The present invention was devised in consideration of the above-described circumstances and aims at suggesting a semiconductor device capable of easily and properly detecting defective element units and a quality management method for such a semiconductor device.

In order to solve the above-described problems, a semiconductor device simulating interactions between nodes in an interaction model is provided according to an aspect of the present invention, wherein the semiconductor device includes: a plurality of element units, each of which is provided corresponding to each of the nodes constituting the interaction model; and a quality management unit that manages quality of each element unit; wherein the element unit includes: a first memory cell that retains a value indicating a state of the node associated with the element unit; one or more second memory cells, each of which retains each interaction coefficient with each of the other nodes causing an interaction with the relevant node; and a logical circuit that determines a value indicating a next state of the node associated with the element unit, based on the interaction coefficient retained in each of the second memory cells and a value which is given from each of the other corresponding element units and indicates the state of each of the other nodes causing the interaction with the node associated with the element unit; wherein the quality management unit: executes a specified quality test for each of the element units; compares test results of the quality test with pre-given results to be obtained from the quality test; and detects the first and/or second memory cell, which is defective, and the element unit which is defective, based on comparison results.

Furthermore, a quality management method for a semiconductor device simulating interactions between nodes in an interaction model is provided according to an aspect of the present invention, wherein the semiconductor device includes: a plurality of element units, each of which is provided corresponding to each of the nodes constituting the interaction model; and a quality management unit that manages quality of each element unit; wherein the element unit includes: a first memory cell that retains a value indicating a state of the node associated with the element unit; one or more second memory cells, each of which retains each interaction coefficient with each of the other nodes causing an interaction with the relevant node; and a logical circuit that determines a value indicating a next state of the node associated with the element unit, based on the interaction coefficient retained in each of the second memory cells and a value which is given from each of the other corresponding element units and indicates the state of each of the other nodes causing the interaction with the node associated with the element unit; wherein the quality management method includes: a first step executed by the quality management unit executing a specified quality test for each of the element units; a second step executed by the quality management unit comparing test results of the quality test with pre-given results to be obtained from the quality test; and a third step of detecting the first and/or second memory cell which is defective, and the element unit which is defective, based on comparison results.

According to this semiconductor device and the quality management method for the semiconductor device, it is possible to detect defective first and/or second memory cells and any defective element unit(s) without performing any cumbersome work.

The present invention enables to realize a semiconductor device capable and a quality management method thereof for easily and properly detecting a defective element unit(s).

BRIEF DESCRIPTION OF THE DRAWINGS

FIG. 19 is a chart for explaining characteristics of each memory according to the third embodiment;

DETAILED DESCRIPTION OF PREFERRED EMBODIMENTS

An embodiment of the present invention will be described below in detail with reference to the attached drawings.

(1) First Embodiment (1-1) Ising Model Extended to Directed Graph

In the present embodiment, a model extended from an Ising model and represented by the following Expression (2) will be hereinafter referred to as the Ising model.

[Math. 2]

$$E(s) = -\sum_{i \neq j} J_{i,j} \sigma_i \sigma_j - \sum_i h_i \sigma_i \quad (2)$$

The difference between the Ising model represented by Expression (1) and the model represented by Expression (2) is that Expression (2) permits interactions as shown in a directed graph. Generally, the Ising model can be drawn as an undirected graph according to graph theory. This is because interactions of the Ising model do not distinguish between an interaction coefficient $J_{i,j}$ from the i-th spin to the j-th spin and an interaction coefficient $J_{j,i}$ from the j-th spin to the i-th spin.

Since the present invention can be applied even by extending the Ising model and distinguishing between $J_{i,j}$ and $J_{j,i}$, the Ising model which is formed into a directed graph is handled in the present embodiment. Incidentally, if the Ising model which is an undirected graph is to be handled by using the Ising model which is a directed graph, it can be done simply by defining the same interaction coefficient for two directions, that is, $J_{i,j}$ and $J_{j,i}$. In this case, even if the same model is used, a value of the energy of the energy function according to Expression (2) is twice as much as the energy of the energy function according to Expression (1).

Figure 1:
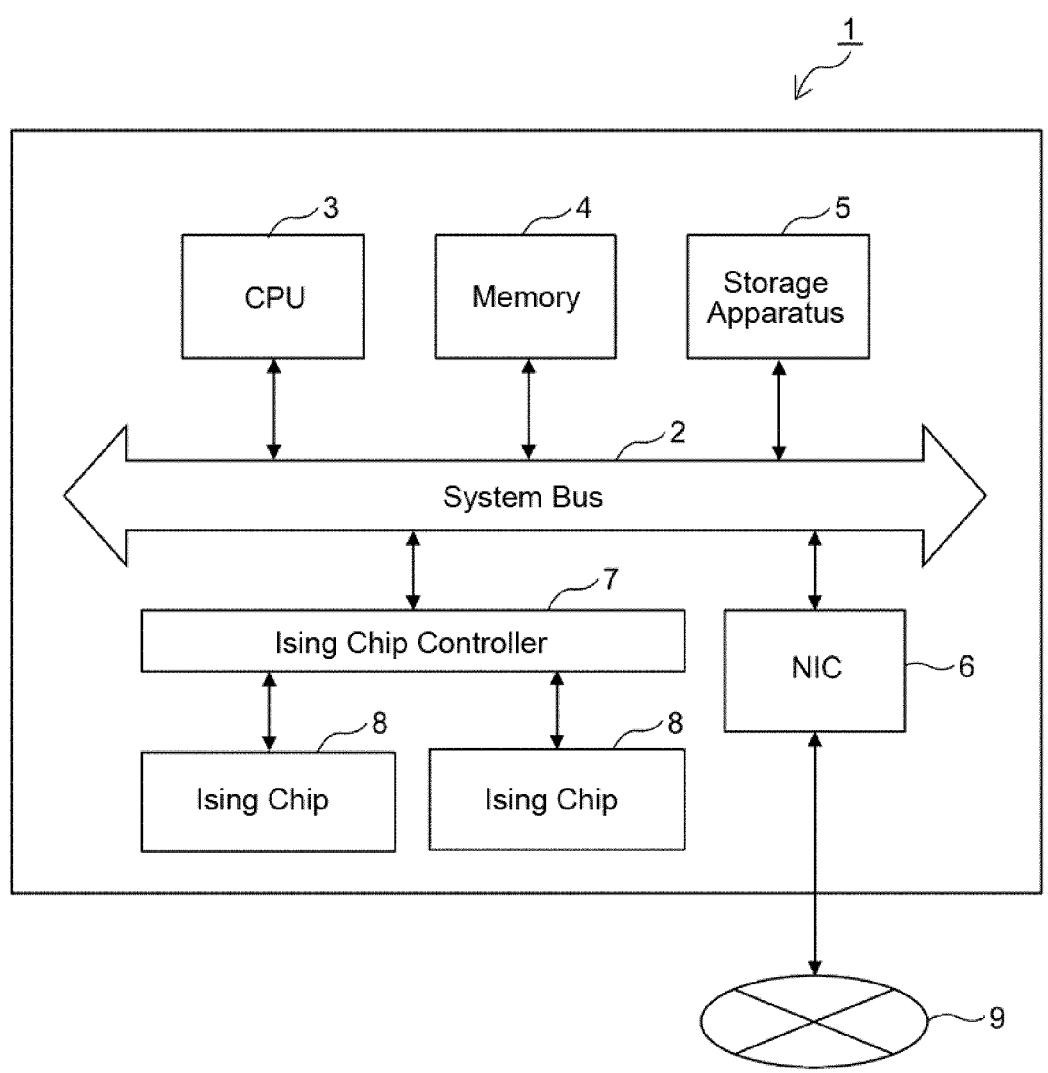
FIG. 1 is a block diagram showing the configuration of an information processing unit according to first to third embodiments.

(1-2) Configuration of Information Processing Unit According to the Present Embodiment (1-2-1) Overall Configuration of Information Processing Unit Referring to FIG. 1, reference numeral 1 represents an information processing unit as a whole according to the present embodiment. This information processing unit 1 is composed of, for example, a personal computer, a workstation, or a server; and includes a CPU (Central Processing Unit) 3, a memory 4, a storage apparatus 5, an NIC (Network Interface Card) 6, and an Ising chip controller 7, which are mutually connected via a system bus 2 composed of, for example, a PCI Express or a QPI, as well as a plurality of Ising chips 8 connected to the Ising chip controller 7.

The CPU 3 is a processor that controls operation of the entire information processing unit 1. Furthermore, the memory 4 is composed of, for example, a volatile semiconductor memory and is used to store various programs. The storage apparatus 5 is composed of, for example, hard disk drives or SSDs (Solid State Drives) and is used to retain programs and data for a long period of time. Furthermore, the NIC 6 is an interface that performs protocol control upon communications with external equipment via a network 9.

The Ising chip controller 7 and the Ising chip 8 correspond to accelerators and take a form of something like an expansion card used by being inserted into peripheral extension interface such as a PCI Express. The Ising chip controller 7 has a function that converts a protocol of the system bus 2 according to the interface of the Ising chip 8. Programs executed by the CPU 3 can control the Ising chip 8 via the Ising chip controller 7 by generally reading/writing data to/from a specific address, for example, by an MMIO (Memory Mapped Input/Output) method. Each Ising chip 8 is dedicated hardware that performs a ground-state search of the Ising model.

(1-2-2) Configuration of Ising Chip

Figure 2:
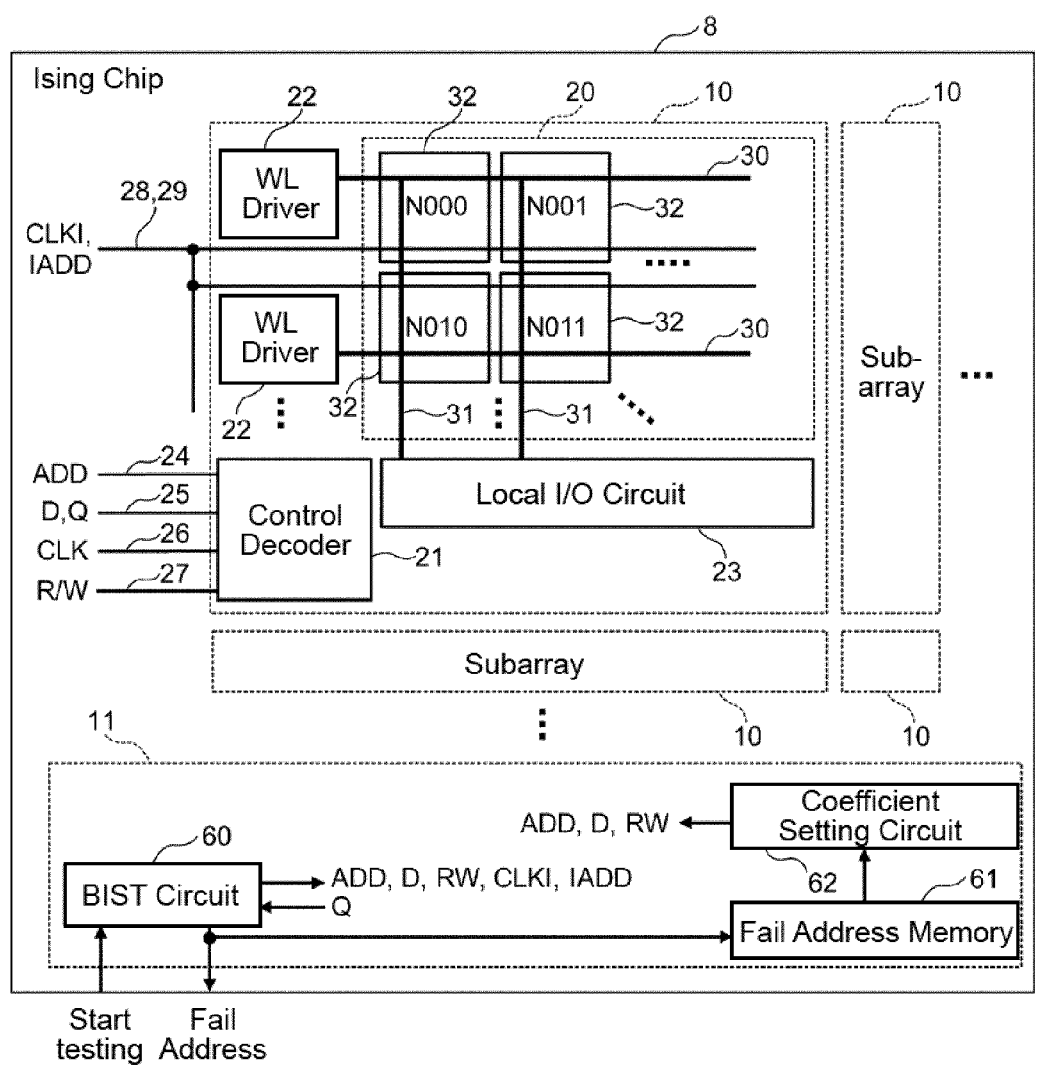
FIG. 2 is a block diagram showing the configuration of an Ising chip according to the first embodiment.

The Ising chip 8 is configured by including a plurality of subarrays 10 and a quality management unit 11 as shown in FIG. 2. The present embodiment will be explained by assuming that the Ising chip 8 is mounted as a CMOS (Complementary Metal-Oxide Semiconductor) integrated circuit which is currently widely known; however, other types of solid-state component are also feasible.

The subarray 10 is configured by including a spin unit group 20, a control decoder 21, a plurality of word line drivers 22, and a local I/O (Input/Output) circuit 23. The subarray 10 also includes an address bus 24, data bus 25, I/O clock line 26, and R/W control line 27 as an SRAM compatibility interface for reading/writing data to/from the spin unit group 20 and they are connected to the control decoder 21. Furthermore, the subarray 10 also includes an interaction address line 28 and an interaction clock line 29 as an interaction control interface for controlling the ground-state search of the Ising model.

The subarray 10 expresses all of the spin $\sigma_i$, the interaction coefficient $J_{i,j}$, and the external magnetic field coefficient $h_i$ of the Ising model with information stored in memory cells described later in the spin unit group 10.

Setting of an initial state of the spin $\sigma_i$ and reading of a solution after completion of the ground-state search are performed via the SRAM compatibility interface. Furthermore, with the subarray 10, reading/writing of the interaction coefficient $J_{i,j}$ and the external magnetic field coefficient $h_i$ to set the Ising model, whose ground state should be searched, to the spin unit group 20 is also performed via the SRAM compatibility interface.

Therefore, an address is assigned to each of the memory cells that retain the spin $\sigma_i$, the interaction coefficient $J_{i,j}$, and the external magnetic field coefficient $h_i$ of the spin unit group 20. Then, when the spin $\sigma_1$, the interaction coefficient $J_{i,j}$ or the external magnetic field coefficient $h_i$, is read from or written to the spin unit group 20, the relevant address ("ADD" in FIG. 2) is given from the CPU 3 to the control decoder 21 via the Ising chip controller 7 (FIG. 1) and the address bus 24, an R/W control signal ("R/W" in FIG. 2) for controlling reading/writing is given from the CPU 3 to the control decoder 21 via the Ising chip controller 7 and the R/W control line 27.

The control decoder 21 activates a word line 30 in the spin unit group 20 by controlling the corresponding word line driver 22 according to the address given via the address bus 24 and activates a corresponding bit line 31 in the spin unit group 20 by controlling the local I/O circuit 23 according to the R/W control signal given via the R/W control line 27. As a result, an initial value of the spin $\sigma_i$ and values of the interaction coefficient $J_{i,j}$ and the external magnetic field coefficient $h_i$ ("D" in FIG. 2), which have been given from the CPU 3 to the control decoder 21 via the Ising chip controller 7 and the data bus 25 are set to the spin unit group 20 or the solution ("Q" in FIG. 2) after completion of the ground-state search, which has been read from the spin unit group 20, is sent to the CPU 3 via the data bus 25 and the Ising chip controller 7.

Incidentally, the address bus 24, the data bus 25, and the RAN control line 27 which constitute the SRAM compatibility interface operate in synchronization with an I/O clock ("CLK" in FIG. 2) sent from the Ising chip controller 7 to each subarray 10 I in the Ising chip 8 via the I/O clock line 26. However, according to the present invention, the interface does not have to be synchronous and may be asynchronous. The present embodiment will be explained on the premise that the interface is synchronous.

Furthermore, the Ising chip 8 implements interactions between spins within the spin unit group 20 of each subarray in order to perform the ground-state search. The interaction control interface is used in order for the CPU 3 to control such interactions via the Ising chip controller 7. Specifically speaking, the CPU 3 gives an interaction address to designate a spin group to perform an interaction ("IADD" in FIG. 2) and an interaction clock ("CLKI" in FIG. 2), respectively, to the spin unit group 20 of each subarray 10 via the Ising chip controller 7 and the interaction control interface and thereby causes the interaction in the spin unit group 20 in synchronization with this interaction clock.

In addition, the Ising chip 8 includes a random number generator (not shown in the drawing) that generates a random number to stochastically invert a value of the memory which represents spins in the Ising model as described later. Then, as the random number generated by this random number generator is given to the spin unit group 20 in each subarray 10 and each spin value of the Ising model in the spin unit group 20 is stochastically inverted by this random number, it is possible to escape from a local optimal solution when executing the interaction.

When the quality management unit 11 executes a preset and predetermined quality test on its own Ising chip 8 and detests as a result of the quality test that any of the spin units 32 (FIG. 3) described later in the Ising chip 8 is defective, the quality management unit 11 is a function unit having a function that controls its own Ising chip 8 and the CPU 3 so as not to have the relevant spin unit 32 cause any adverse effect on other spin units 32 when executing interactions. The details of the quality management unit 11 will be described later.

(1-2-3) Configuration of Spin Unit Group

The spin unit group 20 is configured so that numerous spin units 32 are arranged as element units where each spin unit 32 retains one spin a and its associated interaction coefficient $J_{i,j}$ and external magnetic field coefficient $h_i$ and implements ground-state search operation.

Figure 3:
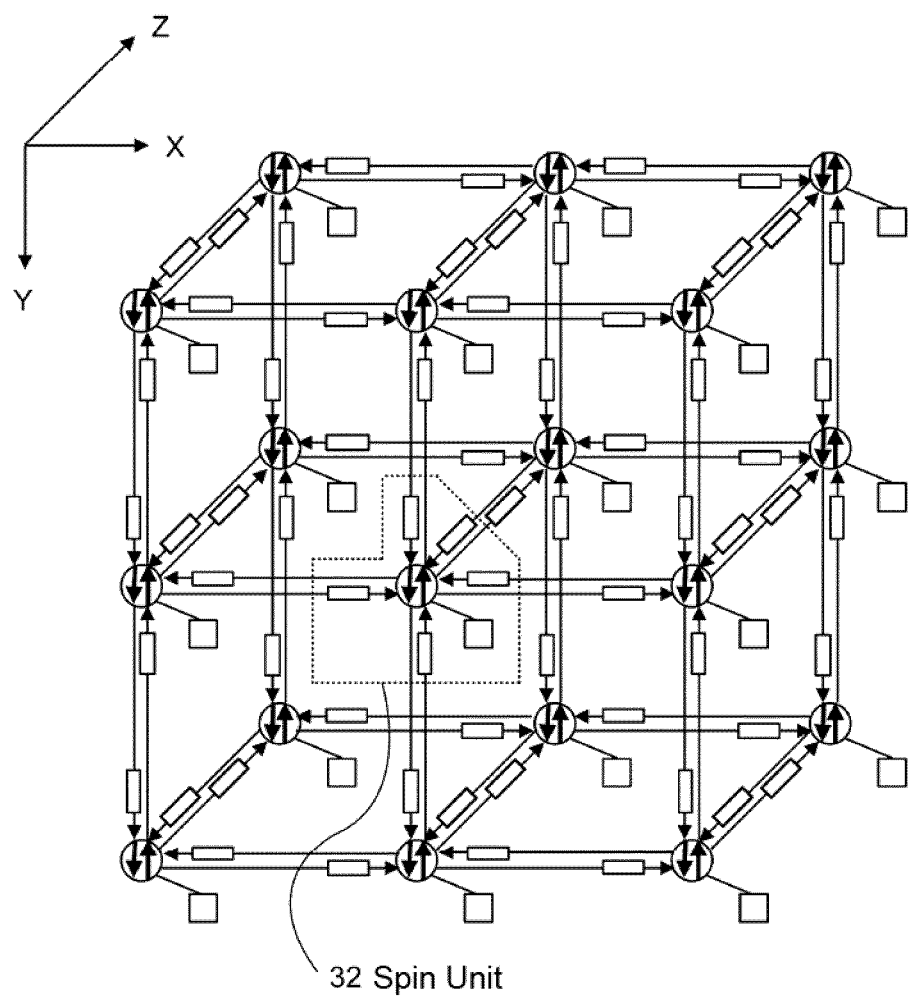
FIG. 3 is a conceptual diagram for explaining an Ising model.

FIG. 3 shows an example in which an Ising model having a three-dimensional lattice topology is configured by arranging a plurality of spin units 32. The example in FIG. 3 is a three-dimensional lattice of a 3 (X-axis direction)×3 (Y-axis direction)×2 (Z-axis direction) size. Coordinate axes are defined as illustrated in the drawing so that the right direction in the drawing is an X-axis, the downward direction in the drawing is a Y-axis, and the depthwise direction in the drawing is a Z-axis; however, these coordinate axes are defined as necessary merely for the convenience of easy explanation of the embodiment and are irrelevant to the present invention. If a topology other than the three-dimensional lattice such as a tree-shaped topology is used, for example, the number of steps of the tree will be used to represent positions separately from the coordinate axes. If interactions between the spins are interpreted as a graph in the three-dimensional-lattice-shaped topology in FIG. 3, a spin of order 5 at maximum (vertex) will be required. Incidentally, if connection of the external magnetic field coefficient is also taken into consideration, degree 6 at maximum will be required.

Values of adjacent spins (for example, in a case of five adjacent spins $\sigma_j, \sigma_k, \sigma_l, \sigma_m, \sigma_n$) are input to one spin unit 32 shown in FIG. 3. Therefore, the spin unit 32 has memory cells to retain these adjacent spin values to be input. The spin unit 32 also has memory cells to retain, in addition to the above-mentioned spin values, the external magnetic field coefficient and interaction coefficients with the above-mentioned adjacent spins (the interaction coefficients $J_{j,i}, J_{k,i}, J_{l,i}, J_{m,i}, J_{n,i}$ with the five adjacent spins), respectively.

Meanwhile, an Ising model has interactions generally represented by an undirected graph as described earlier. The aforementioned Expression (1) includes $J_{i,j} \times \sigma_i \times \sigma_j$ as a term representing an interaction, which indicates an interaction from the i-th spin to the j-th spin. In this case, a general Ising model does not distinguish between the interaction from the i-th spin to the j-th spin and an interaction from the j-th spin to the i-th spin. In other words, $J_{i,j}$ and $J_{j,i}$ are the same. However, with the Ising chip 13 according to the present embodiment, this Ising model is extended to a directed graph (Expression (2)) as described earlier and realizes asymmetric interactions, that is, the interaction from the i-th spin to the j-th spin and the interaction from the j-th spin to the i-th spin. As a result, model representation capability enhances, thereby making it possible to represent many problems with small-scale models.

Therefore, if one spin unit is the i-th spin $\sigma_i$, the interaction coefficients $J_{j,i}, J_{k,i}, J_{l,i}, J_{m,i}, J_{n,i}$ retained by this spin unit 32 determine interactions from the adjacent j-th, k-th, l-th, m-th, and n-th spins $\sigma_j$, $\sigma_k$, $\sigma_l$, $\sigma_m$, $\sigma_n$ to the i-th spin $\sigma_i$. This corresponds to the fact that arrows (interactions) corresponding to the interaction coefficients included in the spin unit 32 in FIG. 3 are directed from spins outside the spin unit 32 shown in the drawing towards spins inside the spin unit 32.

(1-2-4) Configuration of Spin Unit

Figure 6:
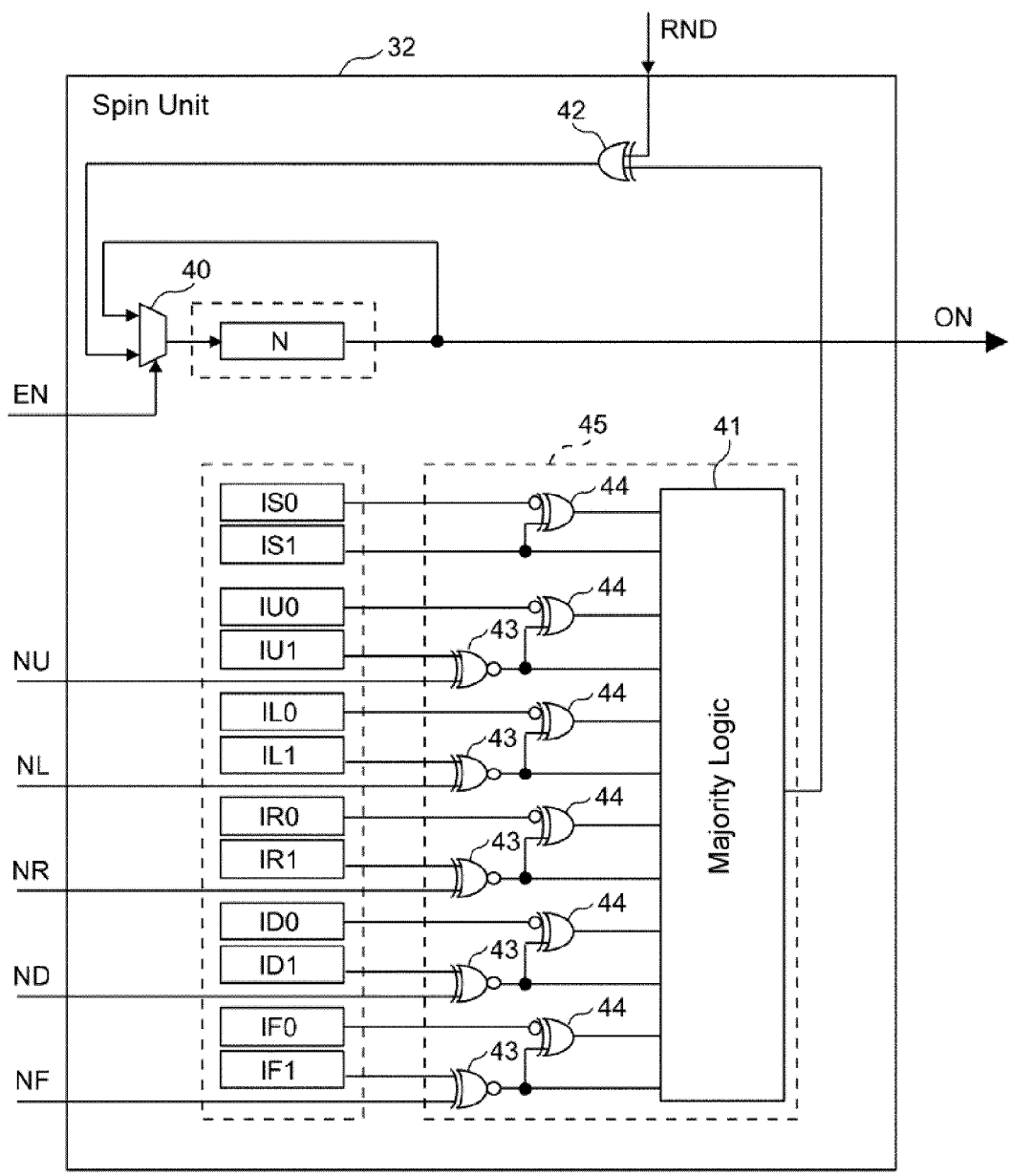
FIG. 6 is a circuit diagram showing the configuration of a spin unit according to the first embodiment.
Figure 7:
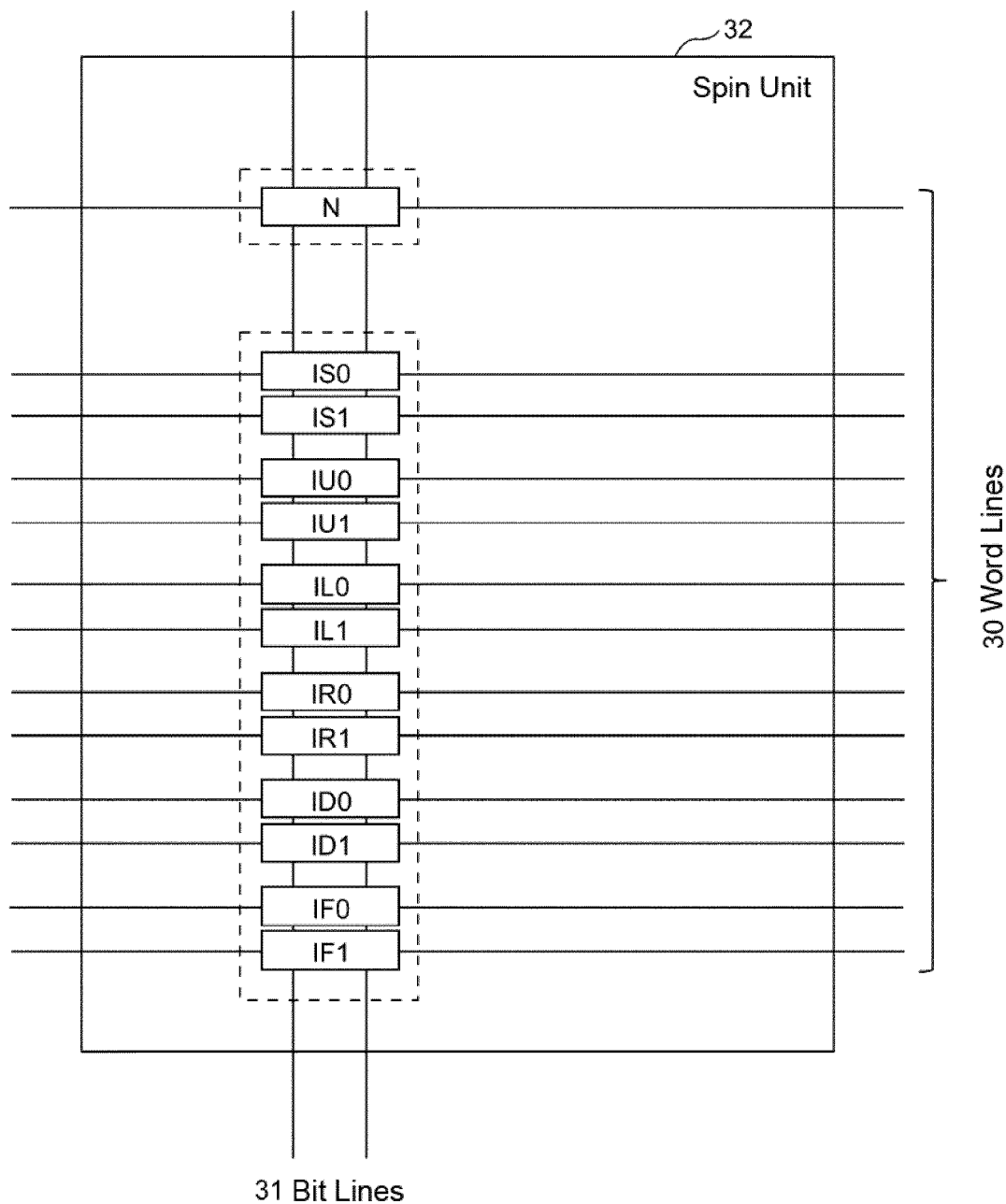
FIG. 7 is a block diagram showing the configuration of the spin unit according to the first embodiment.

A configuration example of the spin unit 32 will be described with reference to FIG. 6 and FIG. 7. The spin unit 32 has two sides, which will be explained separately by using FIG. 6 and FIG. 7 as a matter of convenience; however, one spin unit 32 includes both configurations of FIG. 6 and FIG. 7. FIG. 6 illustrates a circuit for implementing interactions within the spin unit 32 and FIG. 7 illustrates the configuration of the spin unit 32 by focusing on the word lines 30 and the bit lines 31 which are interfaces for accessing memory cells N, IS0, IS1, IU0, IU1, IL0, IL1, IR0, IR1, ID0, ID1, IF0, IF1 included in the spin unit 32 from outside the Ising chip 13.

The spin unit 32 includes a plurality of 1-bit memory cells N, IS0, IS1, IU0, IU1, IL0, IL1, IR0, IR1, ID0, ID1, IF0, IF1 for retaining the spin as, the interaction coefficients $J_{j,i}$ to $J_{n,i}$, and the external magnetic field coefficient $h_i$ of the Ising model. Incidentally, two memory cells serve their role as a pair as follows: the memory cells IS0 and IS1, the memory cells IU0 and IU1, the memory cells IL0 and IL1, the memory cells IR0 and IR1, the memory cells ID0 and ID1, and the memory cells IF0 and IF1. So, they will be hereinafter collectively referred to as the memory cell pair ISx, IUx, ILx, IRx, IDx, or IFx (see FIG. 4).

Figure 8:
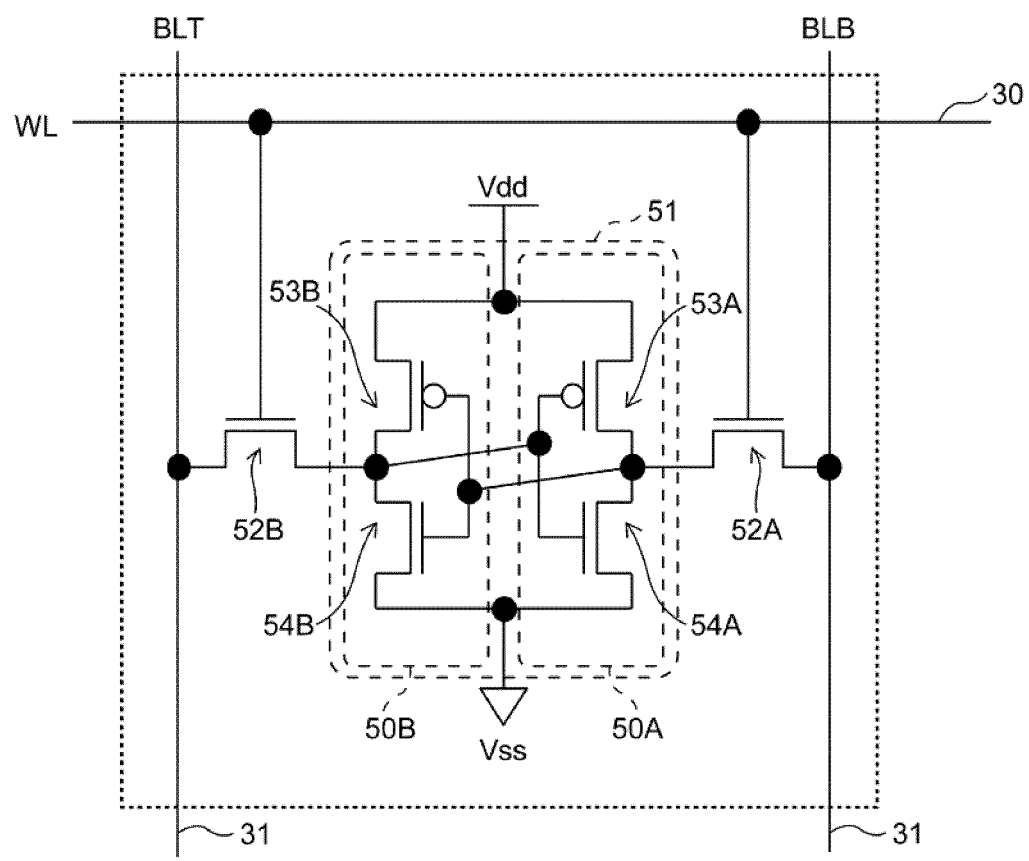
FIG. 8 is a circuit diagram showing the configuration of a memory cell.

A specific configuration example of each memory cell N, IS0, IS1, IU0, IU1, IL0, IL1, IR0, IR1, ID0, ID1, IF0, IF1 included in the spin unit 32 is shown in FIG. 8. The memory cell has a data retaining unit 51 composed of a pair of CMOS (Complementary Metal Oxide Semiconductor) inverters 50A, 50B and reads/writes data from/to the data retaining unit 51 by controlling pass gate transistors 52A, 52B by using the word line 30 and the bit lines 31. Each CMOS inverter 50A, 50B is composed of a p-channel MOS transistor 53A, 53B and an n-channel MOS transistor 54A, 54B.

Now, the spin unit 32 will be described as a spin unit that represents the i-th spin. The memory cell N is a memory cell to represent a spin and retains a spin value. The spin value is +1/−1 (+1 may be expressed as up and −1 may be expressed as down) in the Ising model and this is made to correspond to 0/1 which is a binary value retainable by the memory cell. For example, +1 corresponds to 1 and −1 corresponds to 0.

Figure 4:
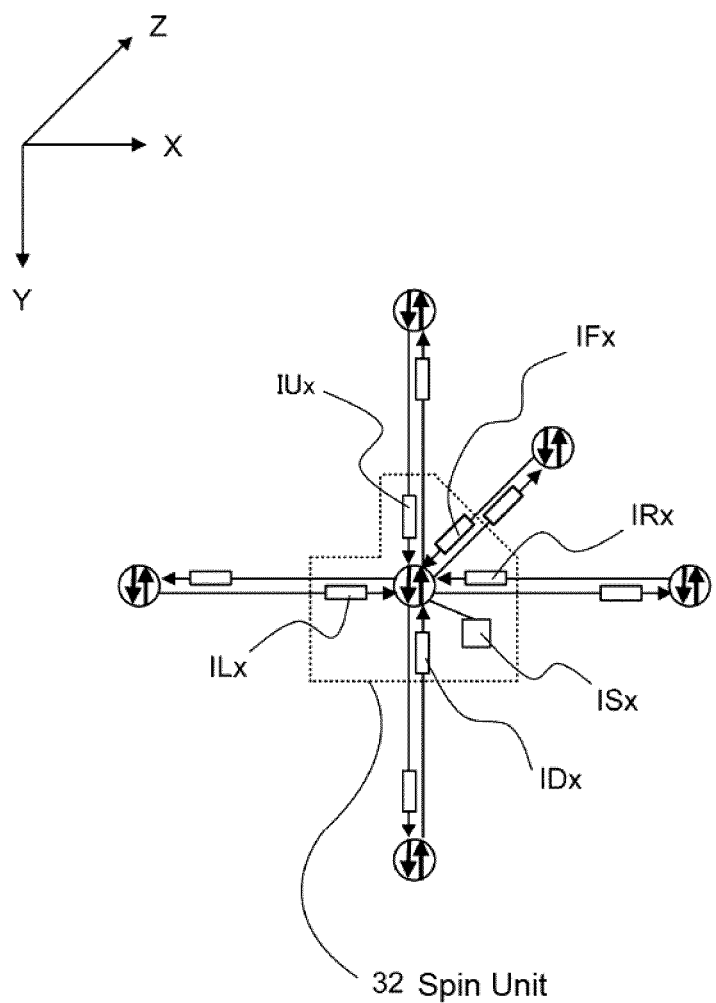
FIG. 4 is a conceptual diagram for explaining a spin unit.

FIG. 4 is used to show a corresponding relationship between the memory cell pairs ISx, IUx, ILx, IRx, IDx, and IFx of the spin unit 32 and the topology of the Ising model shown in FIG. 3. The memory cell pair ISx stores the external magnetic field coefficient. Furthermore, each of the memory cell pairs IUx, ILx, IRx, IDx, and IFx stores an interaction coefficient. Specifically speaking, the memory cell pair IUx stores an interaction coefficient with an upper-side spin (−1 in the Y-axis direction); the memory cell pair ILx stores an interaction coefficient with a left-side spin (−1 in the X-axis direction); the memory cell pair IRx stores an interaction coefficient with a right-side spin (+1 in the X-axis direction); the memory cell pair IDx stores an interaction coefficient with a down-side spin (+1 in the Y-axis direction); and the memory cell pair IFx stores an interaction coefficient with a spin connected in a depthwise direction (+1 or −1 in the Z-axis direction).

Furthermore, if the Ising model is recognized as a directed graph and is seen from a certain spin, other spins have coefficients that influence the present spin. The coefficients by which the relevant spin influence the other spins belong to the respective other spins. Specifically speaking, this spin unit 32 is connected to five spins at maximum. The Ising chip 13 of the present embodiment can deal with three values +1/0/−1 as the external magnetic field coefficient and the interaction coefficients. Therefore, a 2-bit memory cell is required to represent each of the external magnetic field coefficient and the interaction coefficients.

The memory cell pairs ISx, IUx, ILx, IRx, IDx, and IFx represent the three values +1/0/−1 by using a combination of two memory cells whose number at the end of their reference signs is "0" or "1" (for example, in a case of the memory cell pair ISx, the memory cells IS0 and IS1). For example, in the case of the memory cell pair ISx, the memory cell IS1 represents +1/−1; and when a value retained by the memory cell IS1 is 1, it represents +1; and when the value retained by the memory cell IS1 is 0, it represents −1.

In addition, when the value retained by the memory cell IS0 is 0, the external magnetic field coefficient is recognized as 0; and the value retained by the memory cell IS0 is 1, either of +1/−1 determined by the value retained by the memory cell IS1 is recognized as the external magnetic field coefficient. When the external magnetic field coefficient is 0 and if it is assumed that the external magnetic field coefficient is disabled, you can say that the value retained by the memory cell IS0 is an enable bit of the external magnetic field coefficient (the external magnetic field coefficient is enabled when IS0 is 1). Similarly, the memory cell pairs IUx, ILx, IRx, IDx, and IFx which store the interaction coefficients have the coefficients and the bit values correspond to each other.

Each of the memory cells N, IS0, IS1, IU0, IU1, IL0, IL1, IR0, IR1, ID0, ID1, IF0, and IF1 in the spin unit 32 must be designed so that data can be read from or written to it from outside the Ising chip 13. Therefore, each spin unit 32 has the word lines 30 and the bit lines 31 as shown in FIG. 7.

Then, with the subarray 10, the respective spin units 32 are arranged in a tile-like manner on a semiconductor substrate as shown in FIG. 2; and they are connected via the bit lines 31 and the word lines 30, thereby constituting the spin unit group 20; and data can be read from or written to the individual memory cells in each spin unit via the SRAM compatibility interface of the Ising chip 8 in the same manner as in a case of a general SRAM by controlling the spin units 32 using the word line drivers 22 and the local I/O circuit 23.

Figure 5:
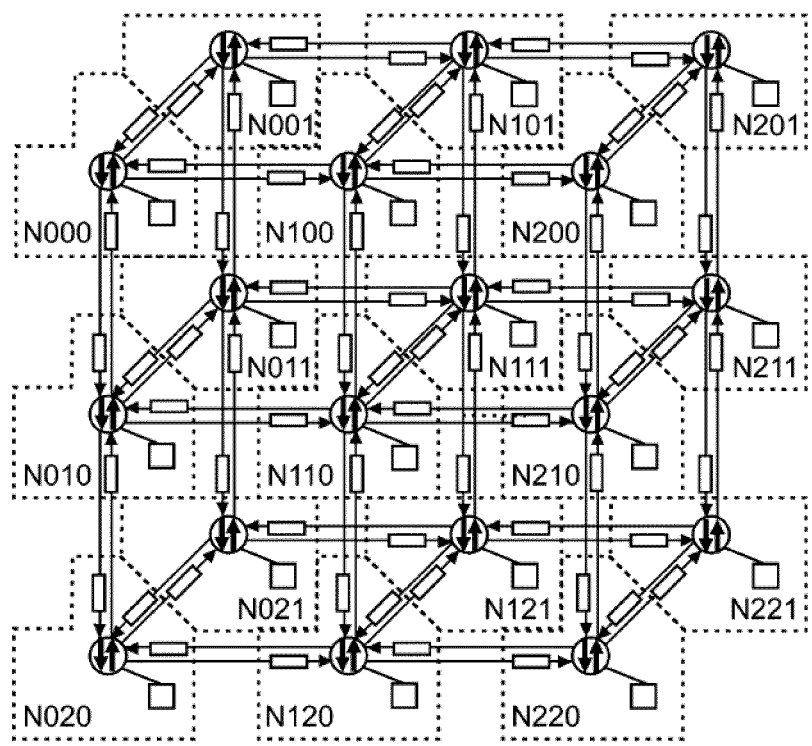
FIG. 5 is a conceptual diagram for explaining a spin unit.

Incidentally, FIG. 5 shows which vertexes in the topology of the three-dimensional lattice the individual spin units 32 represented in FIG. 2 (the reference sing is assigned as, for example, Nxyz according to the position on the X-axis, the Y-axis, and the Z-axis) correspond to. Each lattice vertex is located as if to insert each lattice vertex of an Z-axis-directional lattice vertex array into a space between X-axis-directional lattice vertex arrays in order to locate the 3 by 3 by 2 three-dimensional lattice vertexes on a two-dimensional plane. Specifically speaking, while Nx0z, Nx1z, Nx2z, and so on are located in the Y-axis direction (the down-side of the drawing is the Y-axis positive direction) on the two-dimensional plane in FIG. 2, spin units whose Z-axis direction coordinates are 0 and 1 are located alternately like N0y0, N0y1, N1y0, N1y1, N2y0, N2y1, and so on in the X-axis direction (the right side of the drawing is the X-axis positive direction).

Furthermore, since the spin units 32 are updated at the same time, each spin unit 32 independently has a circuit for deciding the state of the next spin by calculating interactions. Referring to FIG. 6, the spin unit 32 has signal lines EN, NU, NL, NR, ND, NF, ON, and RND as interfaces with outside the spin unit 32. The signal line EN is an interface for inputting a switching signal which permits updates of spins of the relevant spin unit 32. By controlling a selector 40 using this switching signal, the spin value retained by the memory cell N can be updated to a value given from a majority logic circuit 41 described later via an OR circuit 42 to the selector 40.

The signal line ON is an interface for outputting the spin value retained by the relevant spin unit 32 to other spin units 32 (adjacent units in the topology in FIG. 3). Each of the signal lines NU, NL, NR, ND, and NF is an interface for inputting a spin value retained by each of the other spin units 32 (the adjacent units 32 in the topology in FIG. 3). The signal line NU receives input from the upper-side spin (−1 in the Y-axis direction); the signal line NL receives input from the left-side spin (−1 in the X-axis direction); the signal line NR receives input from the right-side spin (+1 in the X-axis direction); the signal line ND receives input from the down-side spin (+1 in the Y-axis direction); and the signal line NF receives input from the spin connected in the depthwise direction (+1 or −1 in the Z-axis direction).

Regarding the spin unit 32, the next state of the relevant spin is determined so as to minimize energy between the adjacent spins. This is equivalent to determining either one of a positive value and a negative value is controlling with respect to a product of the adjacent spins and the interaction coefficients and the external magnetic field coefficient. For example, assuming that the spins $\sigma_j$, $\sigma_k$, $\sigma_l$, $\sigma_m$, and $\sigma_n$ are adjacent to the i-th spin $\sigma_i$, the next state of the spin $\sigma_i$ is determined as described below.

Firstly, it is assumed that values of the adjacent spins are $\sigma_j$=+1, $\sigma_k$=−1, $\sigma_l$=+1, $\sigma_m$=−1, and $\sigma_n$=+1, the interaction coefficients are $J_{j,\,i}$=+1, $J_{k,\,i}$=+1, $J_{l,\,i}$=+1, $J_{m,\,i}$=−1, and $J_{n,\,i}$=−1, and the external magnetic field coefficient is $h_i$=+1. Products of the interaction coefficients and the adjacent spins and the external magnetic field coefficient under this circumstance are as follows: $\sigma_j \times J_{j,\,i}$=+1, $\sigma_k \times J_{k,\,i}$=−1, $\sigma_l \times J_{l,\,i}$=+1, $\sigma_m \times J_{m,\,i}$=+1, $\sigma_n \times J_{n,\,i}$=−1, and $h_i$=+1. The external magnetic field coefficient may be read as an interaction coefficient with a spin whose value is always +1.

Now, local energy between the i-th spin and the adjacent spins is obtained by multiplying each of the aforementioned coefficients by the i-th spin value and further inverting the sign. For example, the local energy with the j-th spin becomes: −1 when the i-th spin is +1; and +1 when the i-th spin is −1. Thus, this arrangement works to reduce the local energy under this circumstance when the i-th spin is +1.

When thinking about the local energy with respect to the external magnetic field coefficient between all the adjacent spins, the calculation is performed to find out which value of the i-th spin, either +1 or −1, can reduce the energy. This may be done simply by counting the number of the values +1 and −1 to see which is larger the number of +1 or the number of −1 when the aforementioned products of the interaction coefficients and the adjacent spins and the external magnetic field coefficient are listed. In the aforementioned example, there are four +1 and two −1. If the i-th spin is +1, a sum of energy will be −2; and if the i-th spin is −1, the sum of energy will be +2. Therefore, the next state of the i-th spin to minimize the energy can be determined by a majority, that is, by deciding the next state of the i-th spin as +1 when the number of +1 is larger, and as −1 when the number of −1 is larger.

The logical circuit 45 shown in FIG. 6 is a circuit for performing the above-described interactions. Firstly, an XNOR circuit 43 is used to find an exclusive NOR (XNOR) of the state of the adjacent spins and the values retained by the memory cells IU1, IL1, IR1, ID1, IF1 which indicate the interaction coefficients +1/−1. Accordingly, the next state of the relevant spin to minimize the energy can be calculated merely by considering its interactions (it is assumed that +1 is encoded as 1 and −1 is encoded as 0).

If the interaction coefficients are only +1/−1, the next state of the relevant spin can be determined by a majority logic, that is, by having a majority logic circuit 44 determine which is larger the number of +1 or the number of −1 among outputs from the XNOR circuit 43. Regarding the external magnetic field coefficient, assuming that it corresponds to an interaction coefficient with a spin whose state is always +1, simply the value of the external magnetic field coefficient becomes a value that should be input to the majority logic circuit 41 which determines the next state of the spin.

Next, a method of realizing the coefficient 0 will be discussed. When there is a majority logic f with n input (I1, I2, I3, and so on up to In), the following proposition can be recognized as true. Firstly, it is assumed that there are duplicates I'1, I'2, I'3, and so on up to I'n of inputs I1, I2, I3, and so on up to In (Ik=I'k for arbitrary k). Under this circumstance, output from f (I1, I2, I3, and so on up to In) is equivalent to that of f to which the duplicates are also input (I1, I2, I3, and so on up to In and I'1, I'2, I'3, and so on up to I'n). In other words, even if two values are input as each input variable, the output will be invariant. Furthermore, it is assumed that, besides the inputs I1, I2, I3, and so on up to In, another input Ix and its inverted value IIx exist. Under this circumstance, output from f (I1, I2, I3, and so on up to In, Ix, IIx) is equivalent to that of f (I1, I2, I3, and so on up to In). Specifically speaking, when the input variables and their inverted values are input, this arrangement works to cancel influences of the input variables by a majority. The coefficient 0 is realized by making use of this property of the majority logic.

Specifically speaking, as shown in FIG. 6, a duplicate of a candidate value of the next state of the relevant spin as mentioned above or its inverted value is simultaneously input to the majority logic circuit 41, with a value of the bit which determines "enable" of the coefficient (the bit retained in each of the memory cells IS0, IU0, IL0, IR0, ID0, and IF0), by using the XOR circuit 44. For example, if a value of the bit retained by the memory cell IS0 is 0, the value of the bit retained in the memory cell IS1 and a value obtained by inverting the value of the bit retained by the memory cell IS1 are simultaneously input to the majority logic circuit 41. So, there will be no influence of the external magnetic field coefficient (the external magnetic field coefficient corresponds to 0). Furthermore, if the value of the bit retained by the memory cell IS0 is 1, the value of the bit retained by the memory cell IS1 and the same value (duplicate) as the above value are input simultaneously to the majority logic circuit 41.

The ground-state search of the applied Ising model can be realized by energy minimization by means of interactions between the aforementioned spins, but performing only the ground-state search might result in a local optimal solution. Basically, there are only movements in a direction to reduce the energy. Thus, once the calculation results in the local optimal solution, it is impossible to get out of it and reach a global optimal solution. Accordingly, since the value of the memory cell, which represents spins, is stochastically inverted as an action to escape from the local optimal solution, the spin unit 32 includes a random number input line RND as an interface.

Then, a random number generated by a random number generator (not shown in the drawing) in the Ising chip 8 as mentioned earlier is given via this random number input line RND to each spin unit 32; and the spin value is stochastically inverted by inputting this random number to the OR circuit 42.

(1-3) Configuration of Quality Management Unit

The quality management unit 11 is configured by including a BIST (Build In Self Test) circuit 60, a fail address memory 61, and a coefficient setting circuit 62 as shown in FIG. 2.

The BIST circuit 60 is hardware with a function that generates, depending on each test content of a plurality of various kinds of preset quality tests, addresses (ADD) to write/read data (0 or 1) to/from each memory cell (N, IS0, IS1, IU0, IU1, IL0, IL1, IR0, IR1, ID0, ID1, IF0, and IF1) of each spin unit 32 for each quality test, data (D) and/or an R/W control signal (R/W), generates interaction clocks (CLKI) and interaction addresses (IADD) to cause interactions at each spin unit 32, and sends the generated addresses, data, R/W control signal, interaction clocks, and/or interaction addresses to each spin unit 32.

Furthermore, the fail address memory 61 is composed of a nonvolatile memory such as an EEPROM (Electrically Erasable Programmable Read Only Memory) or a flash memory and is used to store an identifier of a spin unit 32 having a defective memory cell (hereinafter referred to as the defective memory cell) in the spin unit group 20, which is detected by the quality test executed by the BIST circuit 60 (hereinafter referred to as the defective spin unit 32).

The coefficient setting circuit 62 is hardware having a function that executes processing for preventing the defective spin unit 32 detected by the quality test from influencing other spin units 32 when the Ising chip 8 executes actual interactions. Specifically speaking, the coefficient setting circuit 62 sets a specified value (that is, 0) to a memory cell which retains an interaction coefficient corresponding to a spin value, which is output from that defective spin unit 32, in the spin unit 32 to which that spin value is input (the spin unit 32 retaining the spin value adjacent to the spin whose value is retained by the defective spin unit 32 in the Ising model).

Figure 21:
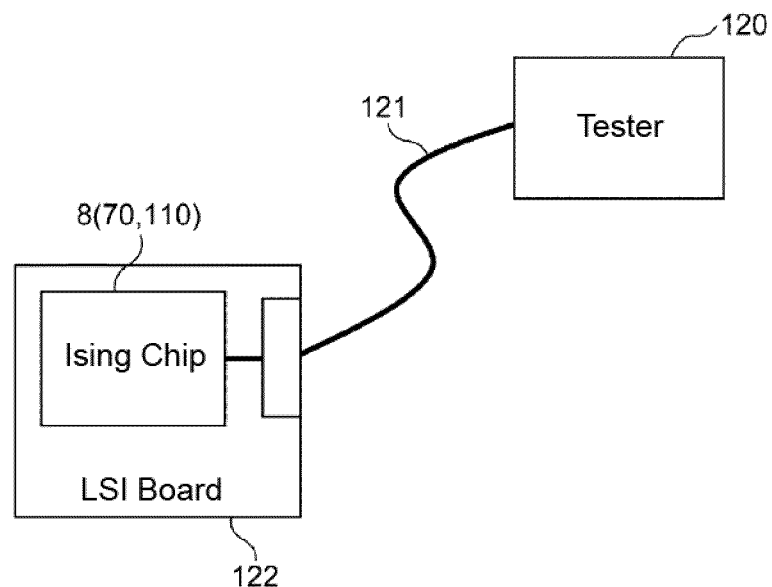
FIG. 21 is a schematic diagram for explaining a test method for a quality test of the Ising chip.

Now, the quality test of the Ising chip 8 is performed by connecting an LSI (Large Scale Integration) board 122, on which the Ising chips are mounted, via a connection cable 121 to a tester 120 as shown in FIG. 21, sending a test start signal from the tester 120 via the connection cable 121 to the LSI board 122, and having the tester 120 read test results of the quality test, which is executed as a result of the above operation, from the LSI board 122 via the connection cable 121.

Then, when receiving such a test start signal, the BIST circuit 60 executes a memory cell test and an interaction test of multiple patterns as a quality test. The memory cell test is a test to actually write/read data 1 and 0 to/from each memory cell in each spin unit 32 and determine whether 1 and 0 have been properly written to or read from these memory cells. Furthermore, the interaction test is a test to set a spin value of a specified pattern, the external magnetic field coefficient, and the interaction coefficients to each spin unit 32, have each spin unit 32 execute interactions of one cycle (one clock of interaction clocks), and determine whether the interactions have been executed property or not by comparing the results of execution of the interactions with results which should be obtained in previously stored test patterns. The interaction test is performed a plurality of times by changing the spin value, the external magnetic field coefficient, and the interaction coefficients which are respectively set to each spin unit 32.

In practice, when receiving the test start signal, the BIST circuit 60 starts the memory cell test, firstly generates an address, data (1 in this case), and an R/W control signal to write 1 to each memory cell in each spin unit 32, and sends them to the control decoder 21 for each subarray 10. Subsequently, the BIST circuit 60 generates an address and an R/W control signal to read values stored in each memory cell in each spin unit 32 and sends them to the control decoder 21 for each subarray 10. As a result, the control decoder 21 for each subarray 10 stores 1 in each memory cell in each spin unit 32 based on the address, data, and R/W control signal which are supplied from the BIST circuit 60, then reads the values stored in each memory cell in each spin unit 32 based on the address and R/W control signal which are supplied from the BIST circuit 60, and sends these read values as test results (Q) to the BIST circuit 60.

Furthermore, the BIST circuit 60 then executes the same processing by changing the value to be written to each memory cell in each spin unit 32 to 0. Subsequently, the BIST circuit 60 determines whether 1 and 0 have been properly written to or read from all the memory cells in all the spin units 32 existing in each subarray 10, based on the test results obtained when 1 and 0 are written to or read from each memory cell in each spin unit 32; and if a memory cell to/from which 1 and 0 fails to be properly written/read (defective memory cell) is detected, the BIST circuit 60 stores the identifier of the defective spin unit 32, which has the defective memory cell, in the fail address memory 61.

Subsequently, the BIST circuit 60 starts the interaction test, generates an address, data, and R/W control signal for writing the data (1 or 0) to each memory cell in each spin unit 32 in each subarray 10 in a specified pattern according to the test content of the then-executed interaction test, and sends them respectively to the control decoder 21 for each subarray 10. Then, the BIST circuit 60 generates an interaction clock and interaction address for having each spin unit 32 perform interactions of one cycle and sends them respectively to each spin unit 32 in each subarray 10. As a result, the control decoder 21 for each subarray 10 writes the data designated to each memory cell in each spin unit 32 by controlling the word line driver 22 and the local I/O circuit 23 based on the address, data, and R/W control signal which are supplied from the BIST circuit 60 and each spin unit 32 executes the interactions of one cycle based on the interaction clock and interaction address which will be given later.

Subsequently, the BIST circuit 60 generates an address and R/W control signal for reading the spin value retained by the memory cell N of each spin unit 32 in each subarray 10 and sends them respectively to the control decoder 21 for each subarray 10. As a result, the control decoder 21 for each subarray 10 reads the spin value retained by the memory cell N of each spin unit 32 based on the address and R/W control signal received from the BIST circuit 60 and sends these read spin values as test results (Q) to the BIST circuit 60.

After receiving the test results of the interaction test, the BIST circuit 60 compares the test results with the results which should be obtained from the interaction test in a previously stored test pattern. Then, the BIST circuit 60 recognizes a spin unit 32, regarding which the actual test results differ from the previously stored results to be obtained, as a defective spin unit 32 and stores its identifier in the fail address memory 61.

Meanwhile, after the aforementioned quality test at specified timing, for example, when the present Ising chip is mounted in the information processing unit 1 as shown in FIG. 1 or when an interaction execution command is then issued from the CPU 3, the coefficient setting circuit 62 reads the identifier of the defective spin unit 32 detected by the aforementioned quality test from the fail address memory 61 and controls the control decoder 21 so that 0 is set to memory cells retaining interaction coefficients corresponding to the spin value in the spin unit 32 influenced by the defective spin unit 32 (the spin unit 32 to which the spin value output from the defective spin unit 32 is input).

Furthermore, the coefficient setting circuit 62 concurrently informs the CPU 3 of the identifier of the defective spin unit 32. As a result, when the CPU 3 then sets, for example, the interaction coefficient to each memory cell in each spin unit 32 of each Ising chip 8 when it has the Ising chip 8 execute interactions, the coefficient setting circuit 62 sets, for example, the interaction coefficients to memory cells other than the memory cells, to which 0 is set by the coefficient setting circuit 62 as described above, so as to avoid overwriting the interaction coefficient in such memory cells to which 0 is set.

(1-4) Quality Test Processing

Figure 9:
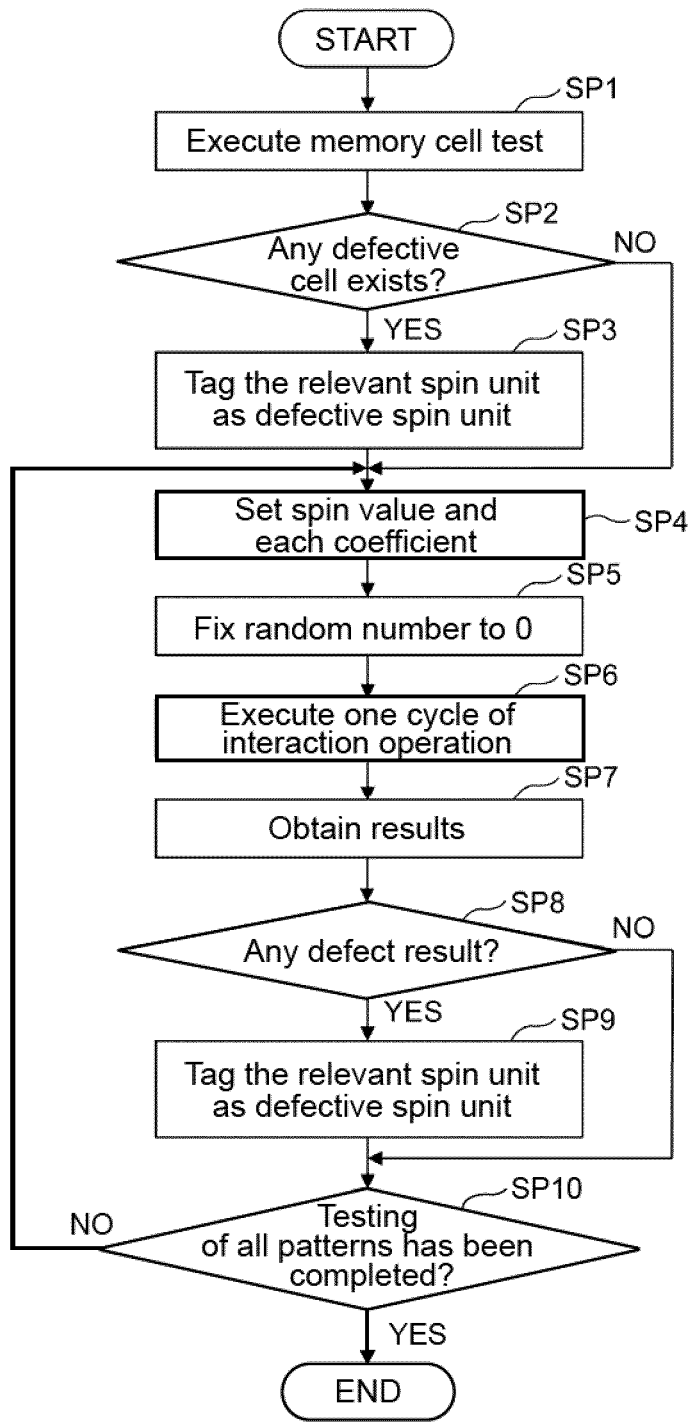
FIG. 9 is a flowchart illustrating a processing sequence for quality test processing according to the first embodiment.

FIG. 9 shows a specific predetermined sequence for quality test processing executed by the quality management unit 11 of the Ising chip 8 which has received the test start signal from the tester 120 described earlier with reference to FIG. 21. After receiving the test start signal, the BIST circuit 60 starts the quality test processing illustrated in this FIG. 9 and firstly executes the aforementioned memory cell test (SP1).

Then, the BIST circuit 60 determines whether a defective memory cell is detected or not, based on the test results of this memory cell test (SP2). If the BIST circuit 60 obtains a negative result in this determining, it proceeds to step SP4. On the other hand, if the BIST circuit 60 obtains an affirmative result, it recognizes a spin unit 32 including the defective memory cell as a defective spin unit 32 and stores the identifier of the defective spin unit 32 in the fail address memory 61 (SP3).

Next, the BIST circuit 60 starts the interaction test, sends the spin value, the external magnetic field coefficient, and the interaction coefficients according to one test pattern among a plurality of preset test patterns, as well as the address and the R/W control signal, respectively, to the control decoder 21 for each subarray 10, and thereby sets the spin value, the external magnetic field coefficient, and the interaction coefficients to each corresponding memory cell in each spin unit 32 (SP4).

Subsequently, the BIST circuit 60 controls the random number generator in the relevant Ising chip 8 to prevent the occurrence of a random number to not make each spin unit 32 input the random number (SP5) and then gives only one clock of interaction clocks to each spin unit 32, thereby causing these spin unit 32s to execute one cycle of interactions (SP6).

Next, the BIST circuit 60 obtains the test results of the interaction test by having the control decoder 21 for each subarray 10 read the spin value retained by each spin unit 32 (SP7) and determines whether or not the thus-obtained spin value retained by each spin unit 32 of each subarray 10 is different from the value previously stored as the result of the then-executed test pattern (whether there is any defective result or not) (SP8).

Then, if the BIST circuit 60 obtains a negative result in this determining, it proceeds to step SP10. On the other hand, if the BIST circuit 60 obtains an affirmative result, it recognizes a spin unit 32 retaining a value different from the spin value, which should be retained as the test result of the then-executed test pattern, as a defective spin unit 32 and stores the identifier of that defective spin unit 32 in the fail address memory 61 (SP9).

Subsequently, the BIST circuit 60 determines whether the interaction test of all the test patterns has been completed or not (SP10). Then, if the BIST circuit 60 obtains a negative result in this determining, it returns to step SP4 and then repeats the processing from step SP4 to step SP10. Then, the BIST circuit 60 eventually completes the interaction test of all the test patterns; and if the BIST circuit 60 thereby obtains an affirmative result in step SP10, it terminates this quality test processing.

(1-5) Advantageous Effects of the Present Embodiment

According to the present embodiment as described above, the quality management unit 11 provided in the Ising chip 8 executes the quality test of each spin unit 32, compares the test results with the predetermined results which should be obtained from that quality test, and detects any defective memory cell based on the comparison result. Therefore, the defective spin unit(s) 32 can be detected easily and properly.

Furthermore, the present embodiment is designed so that 0 is set to the memory cells retaining the interaction coefficients corresponding to the relevant spin in each of the other spin units 32, to which the spin value output from the defective spin unit 32 is input, based on the results of the quality test. So, it is possible to prevent the defective spin unit 32 from causing adverse effects on other spin units 32.

(2) Second Embodiment

Figure 10:
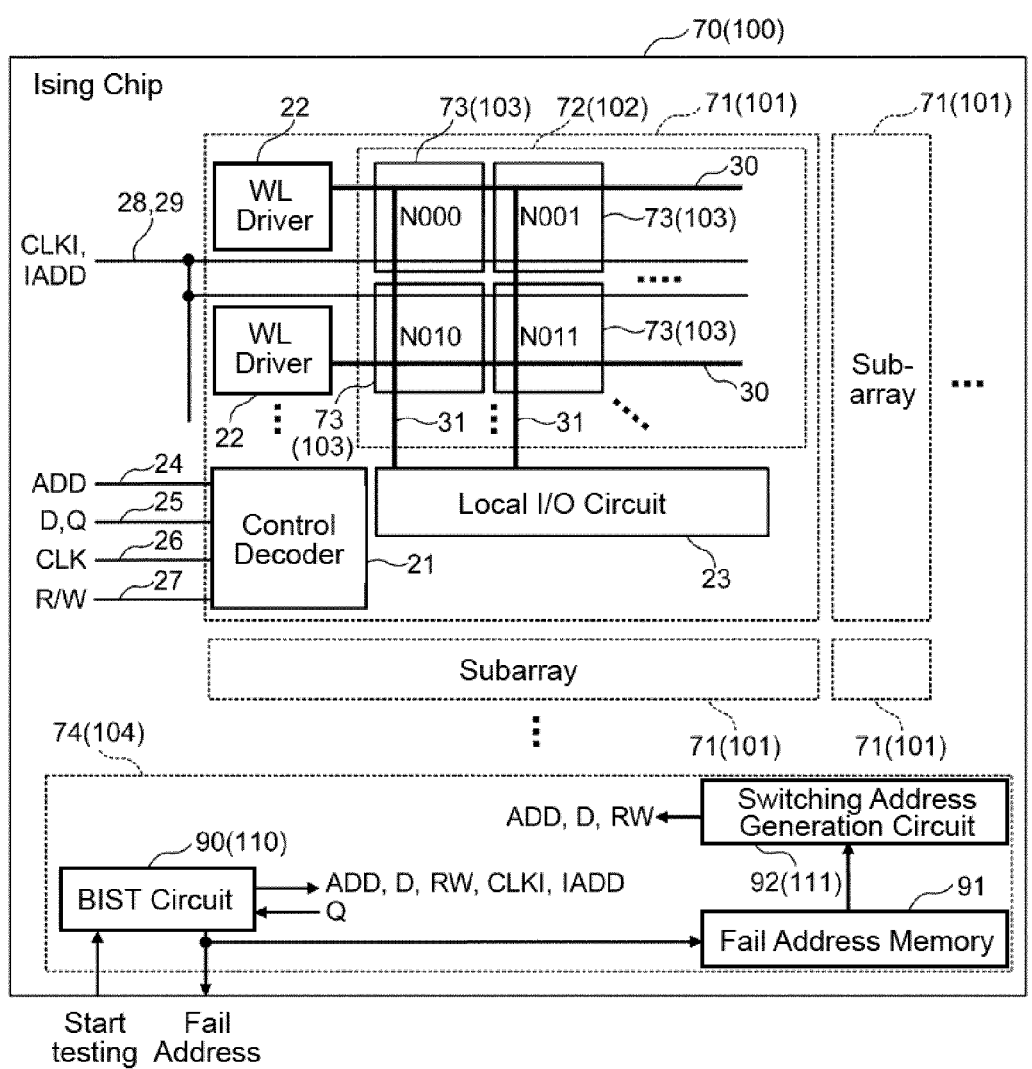
FIG. 10 is a block diagram showing the configuration of an Ising chip according to the second and third embodiments.

FIG. 10 in which the same reference numerals as those in FIG. 2 are assigned to parts corresponding to those in FIG. 2 shows an Ising chip 70 according to a second embodiment which is applied to the information processing unit 1 in FIG. 1, instead of the Ising chip 8 (FIG. 2) according to the first embodiment. This Ising chip 70 is configured in the same manner as the Ising chip 8 according to the first embodiment, except that the configuration of each of spin units 73 constituting a spin unit group 72 of a subarray 71 and the configuration of a quality management unit 74 are different.

Figure 11:
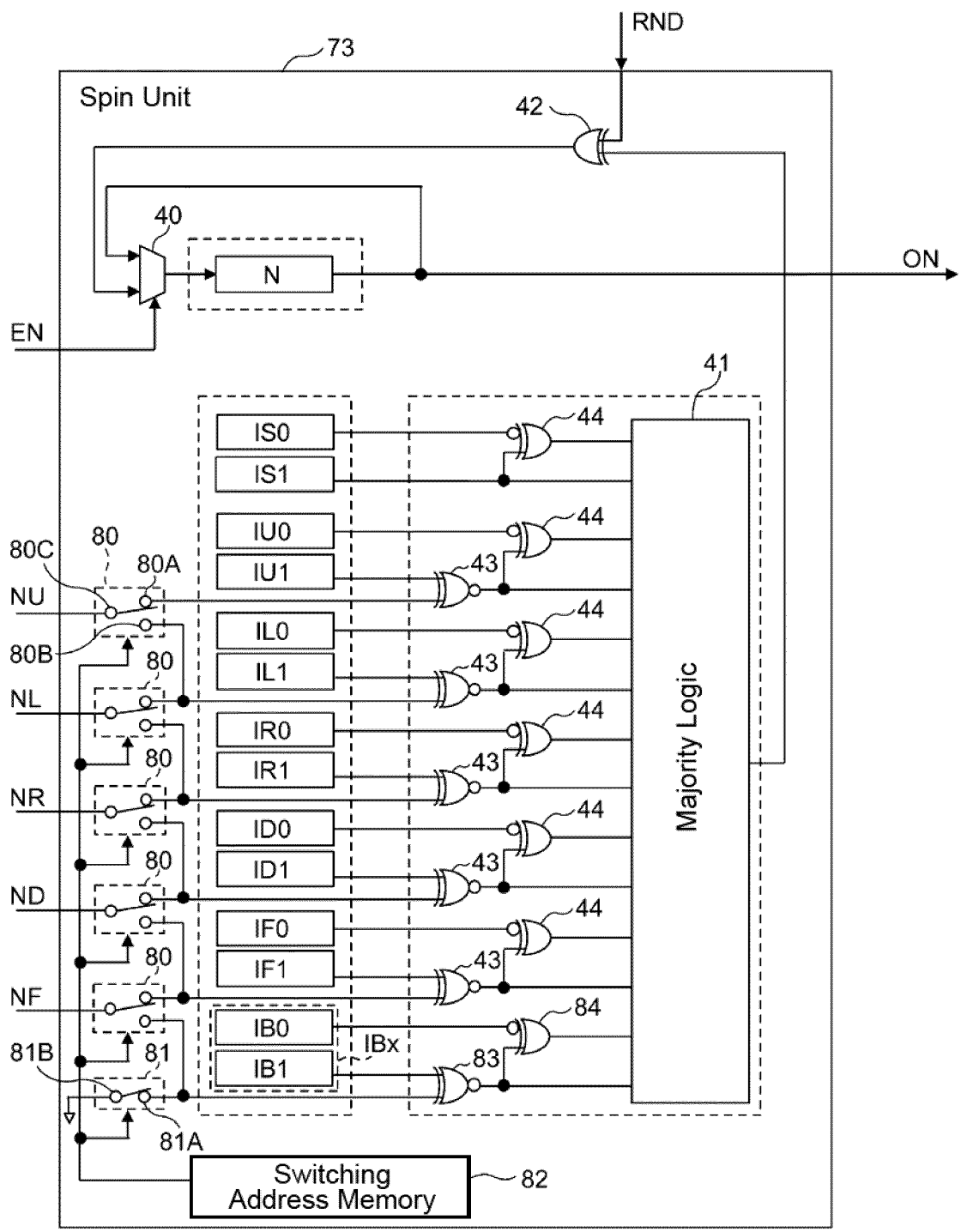
FIG. 11 is a circuit diagram showing the configuration of a spin unit according to the second embodiment.

In practice, in a case of the present embodiment, the spin unit 73 is provided with a memory cell pair composed of two redundant memory cells IB0, IB1, each of which has the same configuration as that of other memory cells (hereinafter referred to as the redundant memory cell pair IBx) in addition to the memory cell pairs IUx, ILx, IRx, IDx retaining interaction coefficients as shown in FIG. 11 in which the same reference numerals as those in FIG. 6 are assigned to parts corresponding to those in FIG. 6. Furthermore, this spin unit 73 is provided with first switching circuits 80 corresponding respectively to the memory cell pairs IUx, ILx, IRx, IDx retaining the interaction coefficients and a redundant memory cell pair switching circuit 81 corresponding to the redundant memory cell pair IBx. Furthermore, the spin unit 73 is provided with a switching address memory 82.

Then, one memory cell IB1 of the redundant memory cell pair IBx is connected to one input end of an XNOR circuit 83 that outputs an exclusive NOR (XNOR) of the state of adjacent spins and a value retained by the memory cell IB1. Furthermore, the other memory cell IB0 of the redundant memory cell pair IBx is connected to one input end of an XOR circuit 84 that outputs an exclusive OR of a value retained by the memory cell IB0 and output from the XNOR circuit 83; and the output from the XRO circuit 84 and the output from the XNOR circuit 83 are supplied to the majority logic circuit 41.

Furthermore, the first switching circuits 80 are assigned serial addresses, respectively. For example, "1" is assigned to the first switching circuit 80 associated with the memory cell pair IUx; "2" is assigned to the first switching circuit 80 associated with the memory cell pair ILx; "3" is assigned to the first switching circuit 80 associated with the memory cell pair IRx; "4" is assigned to the first switching circuit 80 associated with the memory cell pair IDx; and "5" is assigned to the first switching circuit 80 associated with the memory cell pair IFx.

Incidentally, regarding a certain first switching circuit 80, a first switching circuit 80 to which an address larger than that of the relevant first switching circuit 80 by one is assigned will be hereinafter referred to as the "adjacent first switching circuit 80"; and regarding a memory cell pair associated with a certain first switching circuit 80, a memory cell pair associated with the adjacent first switching circuit 80 will be hereinafter referred to as the "adjacent memory cell pair."

Each first switching circuit 80 has a C-contact switch including a normally-closed terminal 80A and a normally-open terminal 80B. Then, the normally-closed terminal 80A of the first switching circuit 80 is connected to the other input end of the XNOR circuit 43 whose one input end is connected to the memory cell IU1, IL1, IR1, ID1, IF1 of the corresponding memory cell pair IUx, ILx, IRx, IDx and IFx; and the normally-open terminal 80B of each first switching circuit 80 is connected to the normally-closed terminal 80A of the adjacent first switching circuit 80 (in a case of the memory cell pair IUx, ILx, IRx, IDx) or is connected to one terminal of the redundant memory cell pair switching circuit 81 (in a case of the memory cell pair IFx). Furthermore, adjacent spin values of the Ising model described with reference to FIG. 3 are supplied from other spin units 73 to a common terminal 80C of each first switching circuit 80.

Furthermore, the redundant memory cell pair switching circuit 81 has a b-contact switch structure; and its one terminal 81A is connected to the other input end of the XNOR circuit 83, whose one input end is connected to the memory cell IB1 of the redundant memory cell pair, and the other terminal 81B is connected to the ground.

The switching address memory 82 is composed of, for example, an SRAM. This switching address memory 82 stores the address of the first switching circuit 80 associated with the memory cell pair IUx, ILx, IRx, IDx, or IFx composed of the defective memory cell detected by a BIST circuit 90 (FIG. 10) of the quality management unit 74 (FIG. 10) described later.

On the other hand, the quality management unit 74 is composed of the BIST circuit 90, a fail address memory 91, and a switching address generation circuit 92. Since the fail address memory 91 has the same configuration as that of the fail address memory 61 according to the first embodiment described earlier with reference to FIG. 2, an explanation about it has been omitted.

The BIST circuit 90 is hardware having a function that performs a quality test of the present Ising chip 70 in the same manner as the BIST circuit 50 according to the first embodiment described earlier with reference to FIG. 2. The BIST circuit 90 is a memory cell (IU0, IU1, IL0, IL1, IR0, IR1, ID0, ID1, IF0, and IF1) used when a defective memory cell(s) detected by the memory cell test retains the interaction coefficient; and if a spin unit 73 regarding which the number of memory cell pairs composed of that defective memory cell (hereinafter referred to as the defective memory cell pairs) is less than the number of the redundant memory cell pair(s) IBx (1 in FIG. 11) exists, the address of the relevant defective memory cell is stored in the fail address memory 91.

Furthermore, if the defective memory cell detected by the memory cell test is the memory cell (N, IS0, IS1) for retaining the spin value or the external magnetic field coefficient or if the number of the defective memory cell pairs is larger than the number of the redundant memory cell pair IBx, the BIST circuit 90 recognizes the spin unit 73 including the defective memory cell as the defective spin unit and stores the identifier of that defective spin unit in the fail address memory 91. Furthermore, if a spin unit 73 which has obtained defective results by the interaction test exists, the BIST circuit 90 recognizes that spin unit 73 as the defective spin unit and stores the identifier of the defective spin unit in the fail address memory 91.

The switching address generation circuit 92 is hardware having a function that executes the same processing as that of the coefficient setting circuit 62 (FIG. 2) according to the first embodiment when the identifier of the defective spin unit 73 is stored in the fail address memory 91, at specified timing, for example, when the relevant Ising chip 70 is mounted in the information processing unit 1 as shown in FIG. 1 or when an interaction execution command is then issued from the CPU 3.

Furthermore, when the address of the defective memory cell is stored in the fail address memory 91, the switching address generation circuit 92 also has a function that generates the address of the first switching circuit 80, which is associated with the defective memory cell in the relevant spin unit 73 (the defective spin unit 73 including that defective memory cell), as a switching address at such specified timing and stores the generated switching address in the switching address memory 82 (FIG. 11) of the defective spin unit 73. When this happens, the switching address generation circuit 92 notifies the CPU 3 of the address of the defective memory cell stored in the fail address memory 91.

On the other hand, regarding the spin unit 73 according to the present embodiment, when the switching address is stored in the switching address memory 82 as described above, the first switching circuit 80 and the redundant memory cell pair switching circuit 81 are notified of that switching address.

In this case, when the switching address reported from the switching address memory 82 is larger than the address assigned to its own assigned address, the first switching circuit 80 does nothing; and when the switching address reported from the switching address memory 82 is equal to or smaller than the address assigned to its own assigned address, the first switching circuit 80 switches a connection destination thereof from the normally-closed terminal 80A to the normally-open terminal 80B. Furthermore, if the redundant memory cell pair switching circuit 81 is notified of the switching address by the switching address memory 82, the status is changed from the closed state to the open state.

Figure 12:
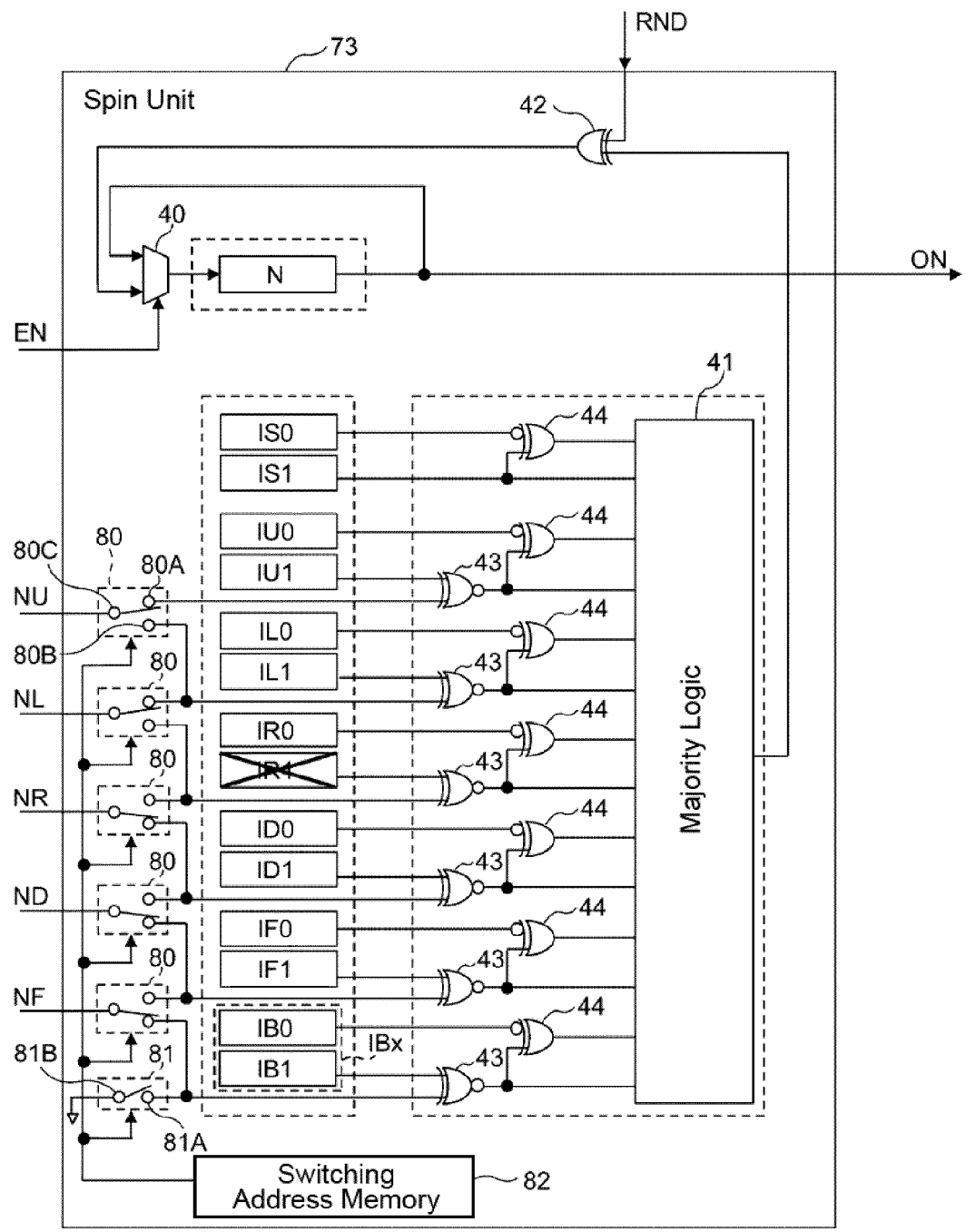
FIG. 12 is a circuit diagram for explaining operation of the spin unit according to the second embodiment.

For example, if the BIST circuit 90 of the quality management unit 74 detects that the memory cell IR1 is defective as shown in FIG. 12, the switching address "3" will be stored in the switching address memory 82 in the example described earlier; and in this case, the first switching circuit 80 associated with the memory cell pair IRx, the first switching circuit 80 associated with the memory cell pair IDx, and the first switching circuit 80 associated with the memory cell pair IFx, whose associated switching address is "3" or more, switch their connection destination from the normally-closed terminal 80A to the normally-open terminal 80B; and the redundant memory cell pair switching circuit 81 enters into the open state.

Accordingly, the memory cell pair corresponding to the adjacent spin value in the Ising model, which is given from each of other corresponding spin units 73, is sequentially switched to the adjacent memory cell pair with respect to each of the defective memory cell pair and its subsequent memory cell pairs (the defective memory cell pair and each memory cell pair which is sequentially adjacent to the defective memory cell pair).

Furthermore, when the CPU 3 which is notified of the address of the defective memory cell by the switching address generation circuit 92 executes interactions, the Ising chip 70 is controlled so that the interaction coefficient which should be stored in each of the memory cell pairs including the defective memory cell pair and its subsequent memory cell pairs is sequentially shifted and stored in a memory cell pair adjacent to each relevant memory cell pair (including the redundant memory cell pair IBx).

For example, in the case of the example in FIG. 12, an interaction coefficient which should be stored in the memory cell pair IRx composed of the memory cells IR0 and IR1 is stored in its adjacent memory cell pair IDx, an interaction coefficient which should be stored in the memory cell pair IDx is stored in its adjacent memory cell pair IFx, and an interaction coefficient which should be stored in the memory cell pair IFx is stored in its adjacent redundant memory cell IBx.

As a result, upon execution of the interactions, the interactions which should be executed by using the interaction coefficients stored in the memory cell pairs including the defective memory cell pair and its subsequent memory cell pairs will be executed by using the interaction coefficients, each of which is stored in each memory cell pair sequentially adjacent to the defective memory cell.

Accordingly, the present embodiment is designed so that even when a defective memory cell(s) is detected by the memory cell test executed by the BIST circuit 90 of the quality management unit 74, if the number of the defective memory cell pairs included in one spin unit 73 is less than the number of the redundant memory cell pair(s) IBx formed in that spin unit 73, interactions can be executed by using that redundant memory cell pair IBx.

Figures 13, 14:
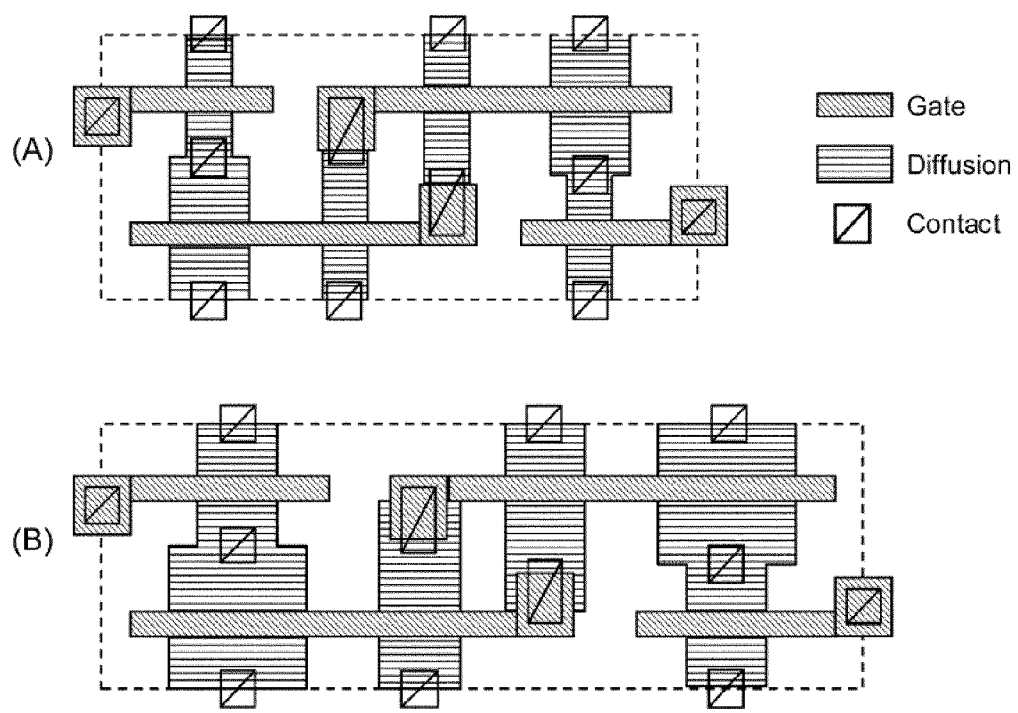
FIG. 13 is a chart for explaining characteristics of each memory according to the second embodiment.
FIG. 14 is a substantially diagrammatic plan view for explaining a layout example of memory cells.

FIG. 13 shows characteristics of each memory cell (N, IU0, IU1, IL0, IL1, IR0, IR1, ID0, ID1, IF0 and IF1) and the switching address memory 82 of the spin unit 73 and the fail address memory 91 of the quality management unit 74 according to the present embodiment. Referring to FIG. 13, a "spin value" column represents the characteristics of the memory cell N retaining the spin value in the spin unit 73; and a "coefficient value" column represents characteristics of the memory cells IU0, IU1, IL0, IL1, IR0, IR1, ID0, ID1, IF0, IF1, IB0, and IB1 retaining the interaction coefficients in the spin unit 73. Furthermore, a "switching address" column represents characteristics of the switching address memory 82; and a "fail address" column represents characteristics of the fail address memory 91.

In the present embodiment as shown in this FIG. 13, each memory cell and the switching address memory 82 in the spin unit 73 are composed of volatile memories such as SRAMs and the fail address memory 91 is composed of a nonvolatile memory. Furthermore, in a case of the present embodiment, the memory cell N retaining the spin value in the spin unit 73 does not have a redundant structure, so that it is required to have a large memory size which can hardly become defective; however, the memory cells IU0, IU1, IL0, IL1, IR0, IR1, ID0, ID1, IF0, and IF1 retaining the interaction coefficients have redundant structures, so that their memory size may be small. Also, the memory size of the switching address memory 82 and the fail address memory 91 may be small.

FIG. 14(A) and FIG. 14(B) illustrate layout examples of the respective memory cells N, IS0, IS1, IU0, IU1, IL0, IL1, IR0, IR1, ID0, ID1, IF0, IF1, IB0, and IB1 in the spin unit 73. FIG. 14(A) is a layout example of the memory cells 73 when the redundant memory cell pair IBx is provided in each spin unit; and FIG. 14(B) is a layout example of the memory cells 73 when the redundant memory cell pair IBx is not provided in each spin unit 73.

As shown in FIG. 14(A) and FIG. 14(B), when the redundant memory cell pair IBx is not provided in each spin unit 73, it is necessary to increase the size of the memory cells so that the memory cells can hardly become defective; however, when the redundant memory cell pair IBx is provided in each spin unit 73, even if there is a defective memory cell, the redundant memory cell pair IBx can be substituted for the defective memory cell, so that the size of the memory cells IU0, IU1, IL0, IL1, IR0, IR1, ID0, ID1, IF0, IF1, IB0, and IB1 retaining the interaction coefficients can be reduced.

Figure 15A:
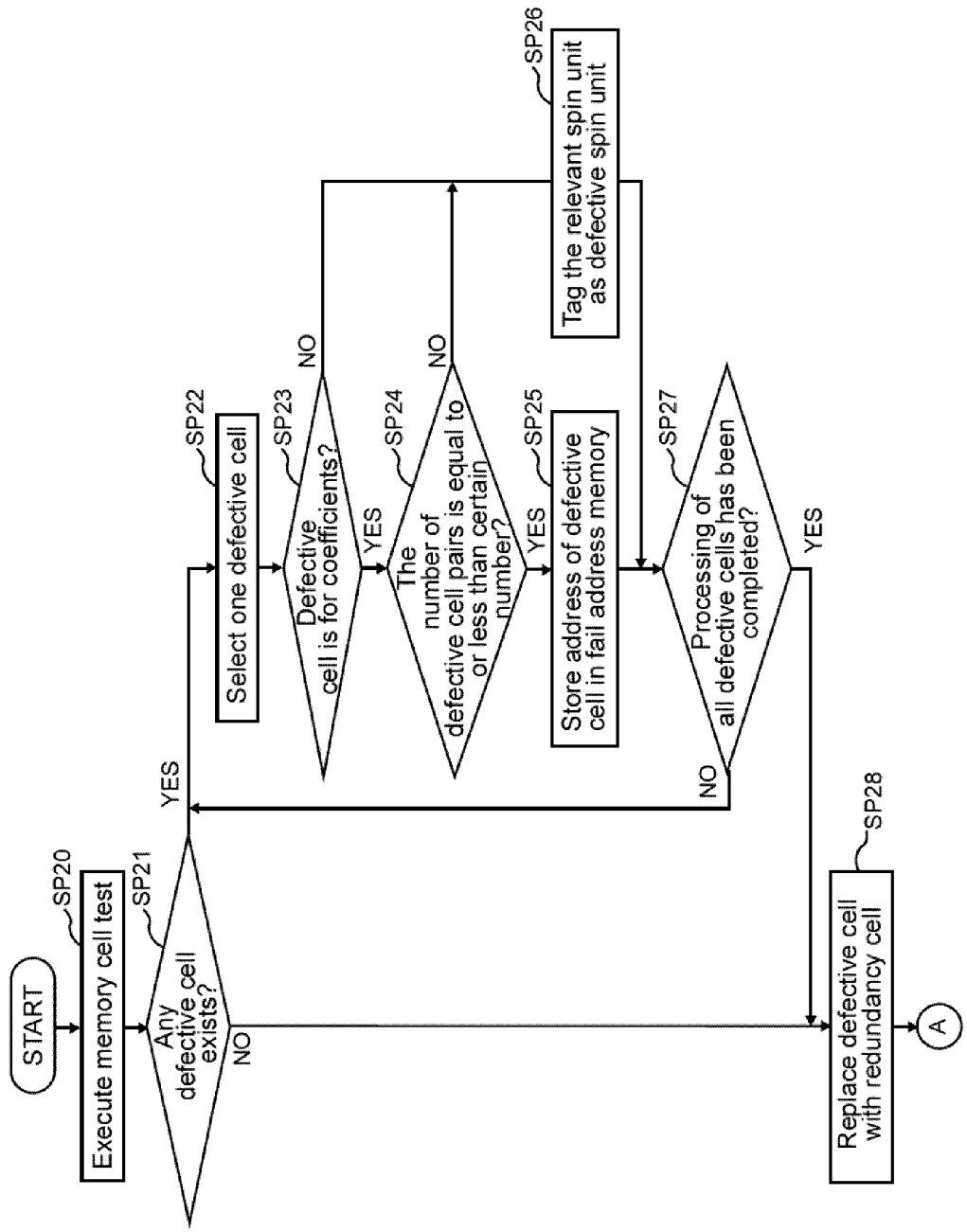
FIG. 15A is a flowchart illustrating a processing sequence for quality test processing according to the second embodiment.
Figure 15B:
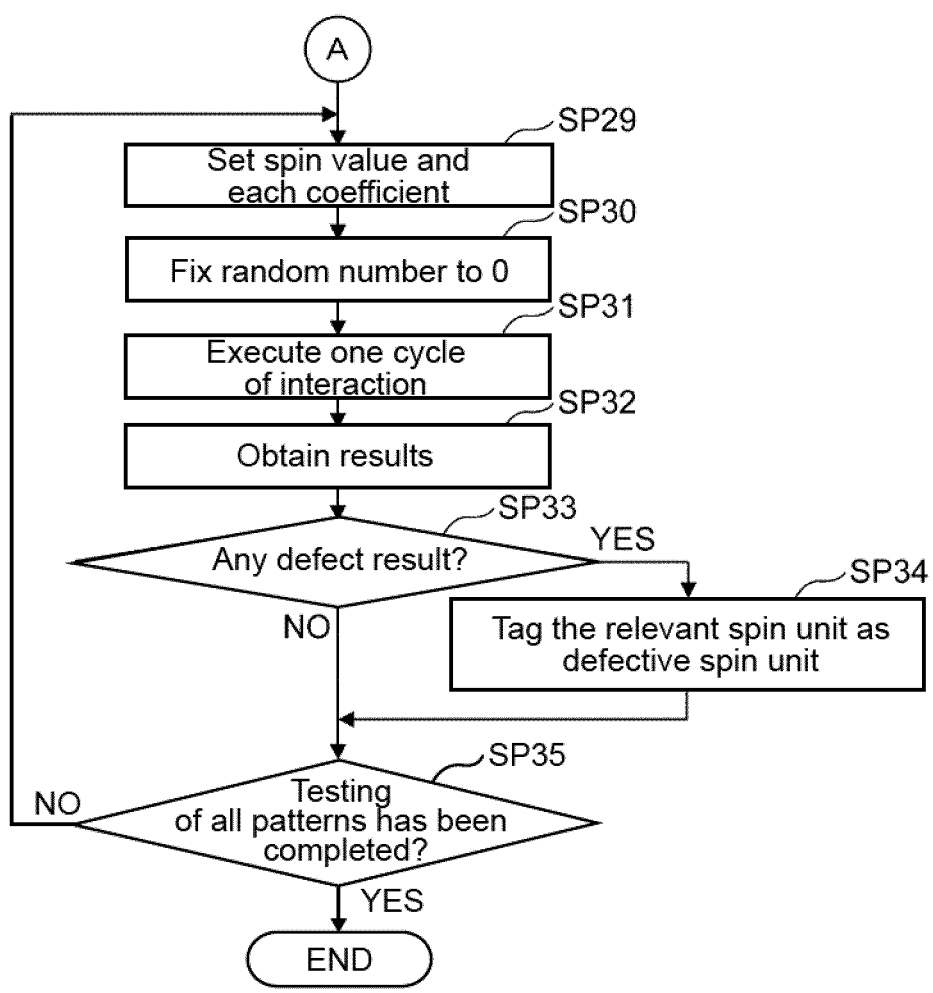
FIG. 15B is a flowchart illustrating a processing sequence for the quality test processing according to the second embodiment.

FIG. 15A and FIG. 15B illustrate a specific processing sequence for the quality test processing according to the present embodiment executed by the BIST circuit 90 for the quality management unit 74 according to the present embodiment in the Ising chip 70 which has received a test start signal from the tester 120 connected via the connection cable 121 as shown in FIG. 21.

After receiving the test start signal, the BIST circuit 90 starts the quality test processing illustrated in this FIG. 15 and firstly executes the aforementioned memory cell test (SP20). Then, the BIST circuit 90 determines whether a defective memory cell is detected or not, based on test results of this memory cell test (SP21). If the BIST circuit 90 obtains a negative result in this determining, it proceeds to step SP28.

On the other hand, if the BIST circuit 90 obtains an affirmative result in the determining in step SP21, it selects one defective memory cell from among the defective memory cells detected by the memory cell test (SP22) and determines whether or not that defective memory cell is the memory cell IU0, IU1, IL0, IL1, IR0, IR1, ID0, ID1, IF0, IF1, IB0, or IB1 for retaining the interaction coefficient (SP23).

If the BIST circuit 90 obtains a negative result in this determining, the BIST circuit 90 recognizes a spin unit 32 including that defective memory cell as a defective spin unit and stores the identifier of that defective spin unit in the fail address memory 61 (SP26), and then proceeds to step SP27.

On the other hand, if the BIST circuit 90 obtains an affirmative result in the determining in step SP23, it determines whether or not the number of the defective memory cell pairs in the defective spin unit 73 including the defective memory cell selected in step SP22 is equal to or less than the number of the redundant memory cell pairs IBx in that spin unit 73 (SP24). Then, If the BIST circuit 90 obtains a negative result in this determining, it executes the processing in step SP26 in the same manner as described earlier and then proceeds to step SP27.

Furthermore, if the BIST circuit 90 obtains an affirmative result in the determining in step SP24, it stores the address of the defective memory cell selected in step SP22 in the fail address memory 91 (SP25) and then determines whether the execution of the processing from step SP22 to step SP26 on all the defective memory cells detected by the memory cell test in step SP20 has been completed or not (SP27).

If the BIST circuit 90 obtains a negative result in this determining, it returns to step SP22 and then repeats the processing from step SP22 to step SP27 while sequentially switching the defective memory cell selected in step SP22 to another unprocessed defective memory cell.

Then, if the BIST circuit 90 eventually obtains an affirmative result in step SP27 by completing the execution of the processing from step SP22 to step SP26 on all the defective memory cells detected by the memory cell test in step SP20, it controls the switching address generation circuit 92 to generate switching addresses corresponding to the addresses of the defective memory cells then stored in the fail address memory 91 and stores the generated switching addresses in the switching address memory 82 for the relevant spin unit 73 (SP28).

As a result, connection destinations of the first switching circuits 80 respectively associated with the respective memory cell pairs, which include the defective memory cell pair and its subsequent memory cell pairs, in that spin unit 73 are switched to the normally-open terminals. Consequently, the relevant memory cell of the adjacent spin value given from each of other spin units 73 is sequentially switched to its adjacent memory cell pair with respect to each memory cell pair, that is, the defective memory cell pair and its subsequent memory cell pairs.

Subsequently, the BIST circuit 90 executes the processing from step SP29 to step SP32 in the same manner as from step SP4 to step SP7 of the quality test processing according to the first embodiment described earlier with reference to FIG. 9. Furthermore, the BIST circuit 90 then determines whether or not there is any spin unit 73 retaining a value different from the previously stored value as the result of the then-executed test pattern (whether there is any defective result or not) (SP33).

If the BIST circuit 90 obtains a negative result in this determining, it proceeds to step SP35. On the other hand, if the BIST circuit 60 obtains an affirmative result, it recognizes a spin unit 73, which retains a value different from the previously stored value as the result of the then-executed test pattern, as a defective spin unit and stores the identifier of the defective spin unit in the fail address memory 91 (SP34).

Next, the BIST circuit 90 determines whether the interaction test of all the test patterns has been completed or not (SP35). Then, if the BIST circuit 90 obtains a negative result in this determining, it returns to step SP29 and then repeats the processing from step SP29 to step SP35. Then, if the BIST circuit 90 eventually obtains an affirmative result in step SP35 by completing the interaction test of all the test patterns, it terminates this quality test processing.

Figure 16:
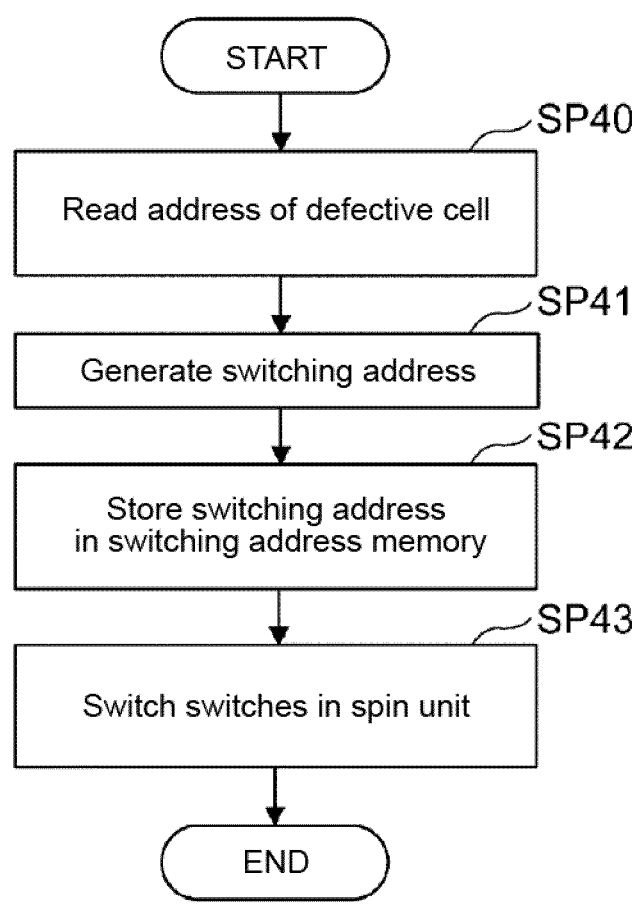
FIG. 16 is a flowchart illustrating a processing sequence for pre-interaction processing.

On the other hand, FIG. 16 shows a processing sequence for pre-interaction processing executed by the Ising chip 70, for example, when the relevant Ising chip 70 is mounted in the information processing unit 1 as shown in FIG. 1 or when an interaction execution command is then issued from the CPU 3. The Ising chip 70 executes the pre-interaction processing for sequentially replacing each memory cell pair, that is, the defective memory cell pair and its subsequent memory cell pairs, with its adjacent memory cell pair with respect to the spin unit 73 including the defective memory cell detected by the aforementioned memory cell test in accordance with the processing sequence illustrated in this FIG. 16.

In practice, regarding such pre-interaction processing, the switching address generation circuit 92 (FIG. 10) for the quality management unit 74 in the Ising chip 70 firstly reads the address of the defective memory cell from the fail address memory 91 (FIG. 10) (SP40) and converts the read address into the corresponding first switching circuit 80 (FIG. 11), thereby generating the aforementioned address (SP41). Then, the switching address generation circuit 92 stores the generated switching address in the switching address memory 82 (FIG. 11) of the relevant spin unit 73 (SP42).

As a result, with the spin unit 73 in which the switching address is stored in its switching address memory 82, a connection destination of each first switching circuit 80 of the relevant first switching circuit 80 and its subsequent first switching circuits 80 is switched to the normally-open terminal 80B (FIG. 11) and also the redundant memory cell pair switching circuit 81 (FIG. 11) is switched to the open state, thereby each memory cell pair, that is, each of the defective memory cell pair and its subsequent memory cell pairs, is sequentially replaced with its adjacent memory cell pair (SP43). Subsequently, this pre-interaction processing is terminated.

Incidentally, in the case of the present embodiment, the switching address generation circuit 92 reads the identifier of the defective spin unit 73 from the fail address memory 91 in parallel with the aforementioned pre-interaction processing, sets "0" to memory cells retaining the interaction coefficient corresponding to the spin value in the spin unit 73, to which the spin value output from that defective spin unit 73 is input, and also executes processing for notifying the CPU 3 of the identifier of the defective spin unit 73.

Consequently, when setting, for example, the interaction coefficient to each memory cell of each spin unit 73 in each Ising chip 70 before having its Ising chip 70 executes interactions, the CPU 3 sets, for examples, the interaction coefficients to memory cells other than the relevant memory cell to which 0 is set by the switching address generation circuit 92 so that the interaction coefficient in the memory cell to which 0 is set will not be overwritten.

The present embodiment is designed as described above so that the redundant memory cell pair IBx is provided in the spin unit 73; and when a defective memory cell(s) is detected among the memory cells retaining the interaction coefficients by the memory cell test, the necessary first witching circuit 80 is switched to use the redundant memory cell pair IBx instead of the defective memory cell pair IUx, ILx, IRx, IDx and IFx composed of the defective memory cell. So, in addition to the same advantageous effects obtained by the first embodiment, the advantageous effect of being capable of using the spin unit 73 including the defective memory cell can be also obtained.

(3) Third Embodiment

Referring to FIG. 10, reference numeral 100 represents an Ising chip as a whole according to the third embodiment.

This Ising chip 100 is configured in the same manner as the Ising chip 70 according to the first embodiment, except that the configuration of each of spin units 103 constituting a spin unit group 102 in each subarray 101 and the configuration of a quality management unit 104 are different.

Figure 17:
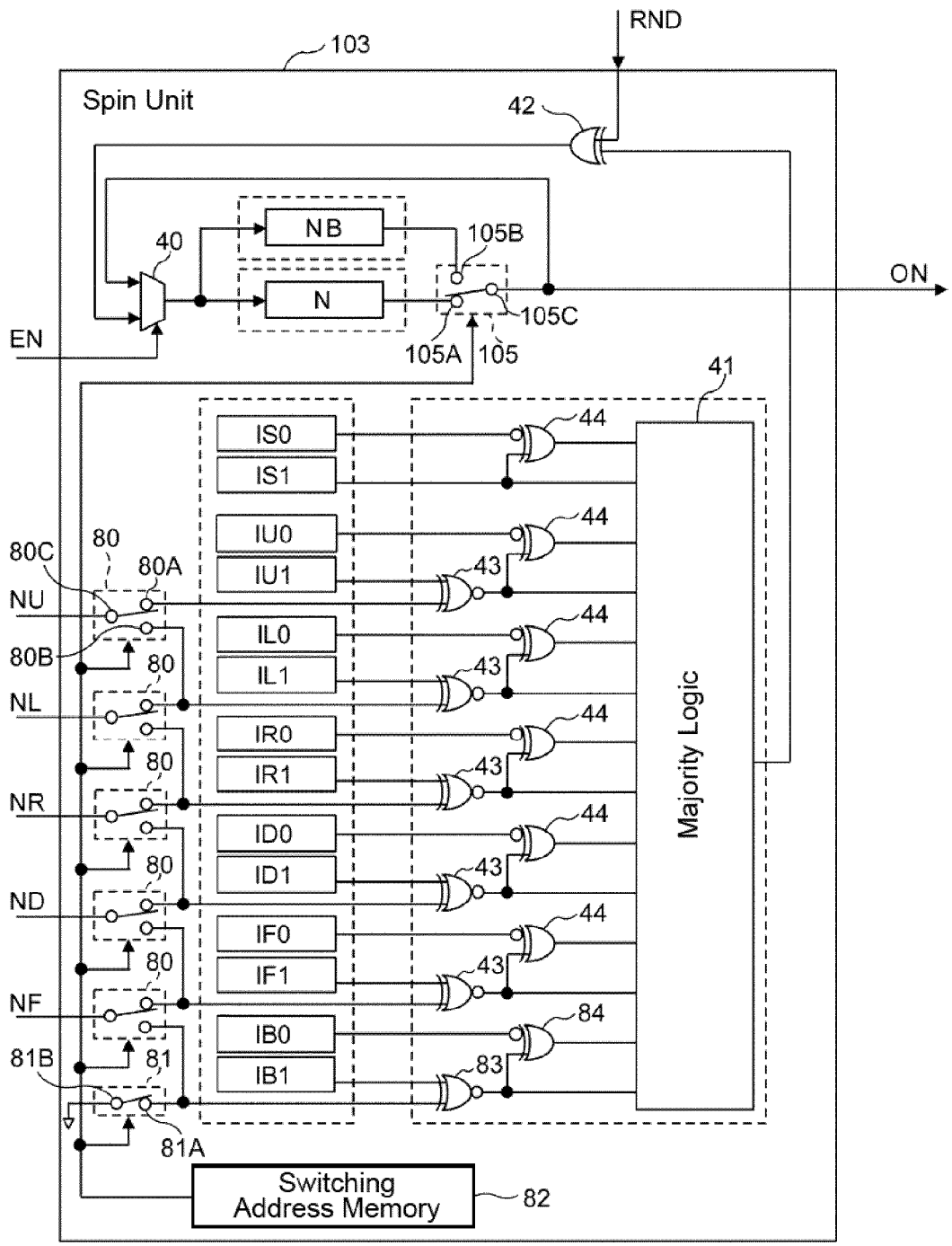
FIG. 17 is a circuit diagram showing the configuration of a spin unit according to the third embodiment.
Figure 18:
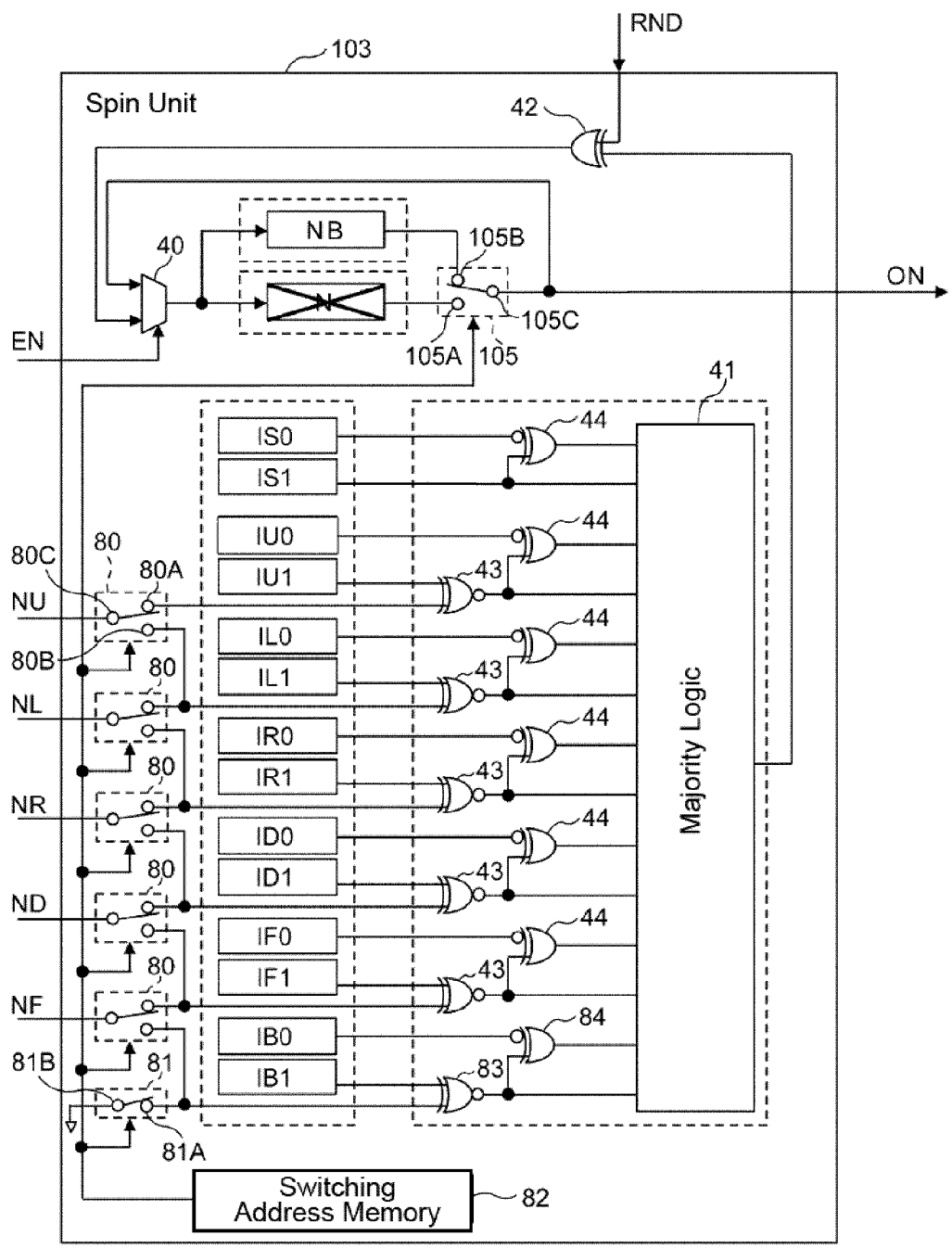
FIG. 18 is a circuit diagram for explaining operation of the spin unit according to the third embodiment.

FIG. 17 in which the same reference numerals are assigned to parts corresponding to those in FIG. 11 shows the spin unit 103 according to the third embodiment. The difference between the spin unit 103 according to the present embodiment and the spin unit 73 (FIG. 11) according to the second embodiment is that the spin unit 103 is provided with a redundant memory cell NB corresponding to a memory cell N retaining a spin value (hereinafter referred to as the redundant memory cell NB) and the spin value retained by the memory cell N and a spin value retained by the redundant memory cell NB can be switched as a spin value retained by the spin unit 103.

In practice, regarding the spin unit 103 according to the present embodiment, an output end of the memory cell N retaining the spin value is connected to a normally-closed terminal 105A of a second switching circuit 105 which has a c-contact switch structure. Furthermore, an input end of the redundant memory cell NB, together with an input end of the memory cell N, is connected to an output end of the selector 40 and an output end of the redundant memory cell NB is connected to a normally-open terminal 105B of the second switching circuit 105. Then, regarding this spin unit 103, the switching address stored in the switching address memory 82 is also reported to the second switching circuit 105.

On the other hand, in the case of the quality management unit 104 (FIG. 10) according to the present embodiment, even if a defective memory cell detected by the memory cell test is the memory cell N for retaining the spin value, the BIST circuit 110 (FIG. 1) stores the address of that defective memory cell in the fail address memory 91.

Furthermore, when the address of the memory cell N for retaining the spin value is stored in the fail address memory 91, for example, when the present Ising chip is mounted in the information processing unit 1 as shown in FIG. 1 or when an interaction execution command is then issued from the CPU 3, the switching address generation unit 111 has, in addition to the same function as that of the switching address generation circuit 92 (FIG. 10) according to the second embodiment, a function that generates an address of the second switching circuit 105, stores the generated address in the switching address memory 82 of the relevant spin unit 103 as the switching address, and notifies the CPU 3 of the address of the memory cell N for retaining the spin value.

Then, if the address of the second switching circuit 105 is stored as a switching address in the switching address memory 82 with respect to the spin unit 103 according to the present embodiment, that switching address is also reported to the second switching circuit 105 as described above. Therefore, when the address assigned to the second switching circuit 105 itself is given as the switching address, the second switching circuit 105 switches the connection destination from the normally-closed terminal to the normally-open terminal.

Furthermore, when the CPU 3 which has been notified of the address of the defective memory cell by the switching address generation unit 111 executes interactions, it controls the Ising chip 100 to store a spin value, which should be stored in the memory cell N, in the redundant memory cell NB.

As a result, upon execution of an interaction, the spin unit 103 executes the interaction by using the interaction coefficient by utilizing the redundant memory cell NB instead of the memory cell N and the spin value retained by this redundant memory cell NB is finally output as the result of the interaction.

Accordingly, the present embodiment is designed so that even when the memory cell N retaining the spin value is detected as a defective memory cell by the memory cell test executed by the BIST circuit 110 of the quality management unit 104, the interaction can be executed by using the redundant memory cell NB.

FIG. 19 shows characteristics of each memory cell (N, NB, IS0, IS1, IU0, IU1, IL0, IL1, IR0, IR1, ID0, ID1, IF0 and IF1) and the switching address memory 82, and the fail address memory 91 of the spin unit 103 according to the present embodiment. In the case of the present embodiment, the memory cell N retaining the spin value in the spin unit 103 has a redundant structure. So, the difference between the present embodiment and the second embodiment described earlier with reference to FIG. 13 is that the memory size can be reduced in the present embodiment.

Figure 20A:
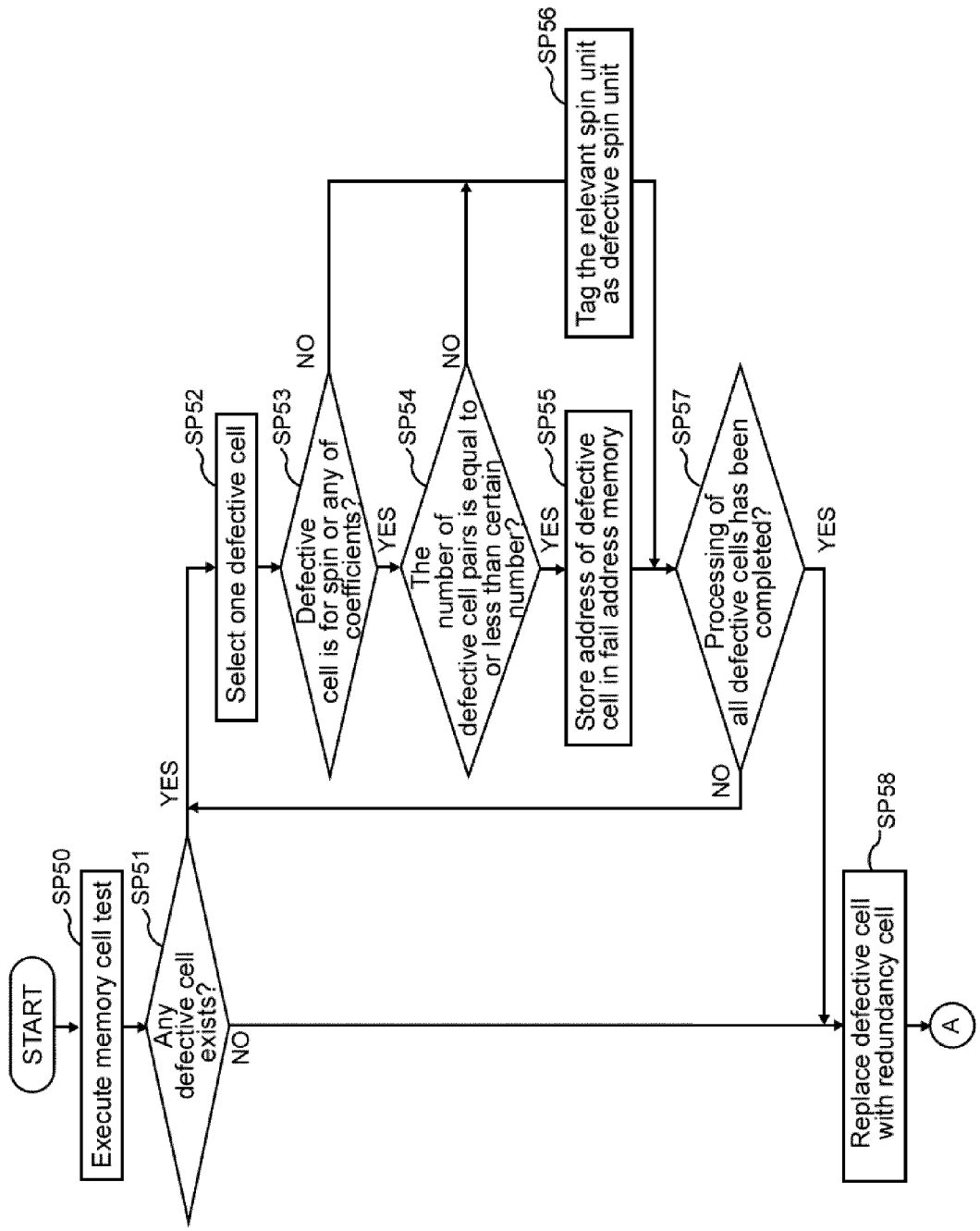
FIG. 20A is a flowchart illustrating a processing sequence for quality test processing according to the third embodiment.
Figure 20B:
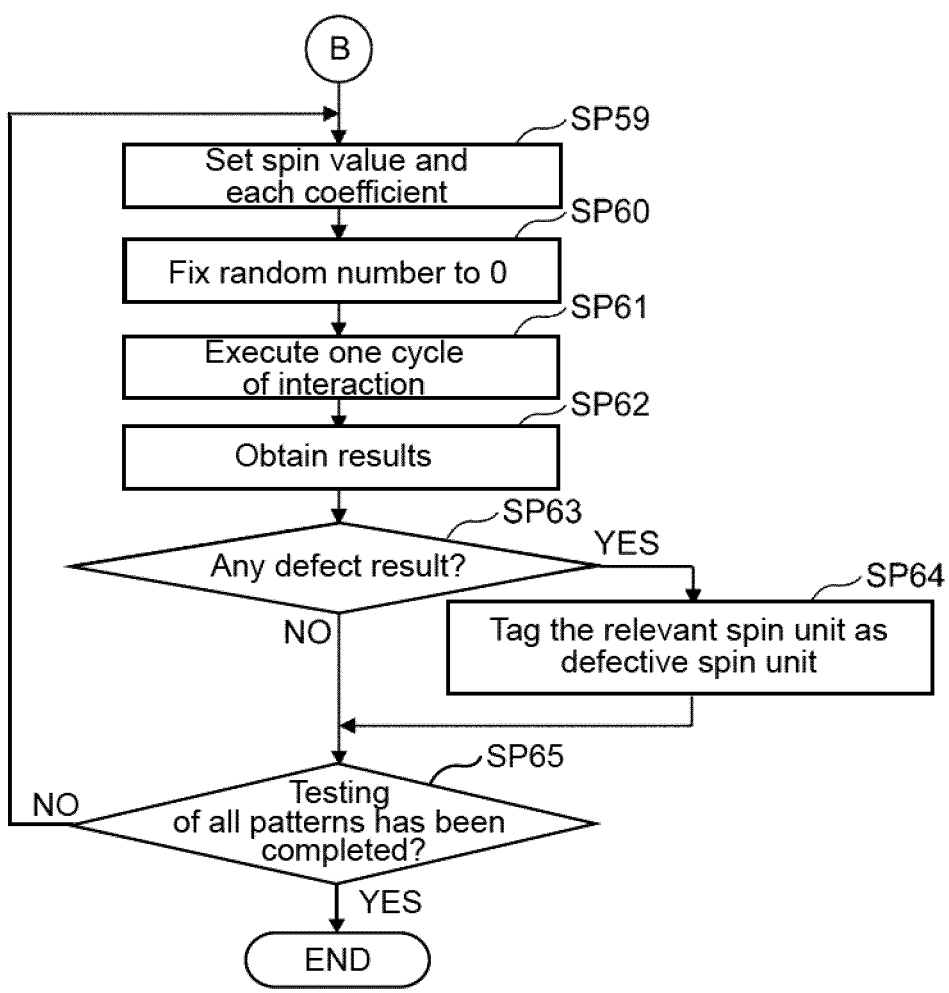
FIG. 20B is a flowchart illustrating a processing sequence for the quality test processing according to the third embodiment.

FIG. 20 illustrates a specific processing sequence for the quality test processing according to the present embodiment executed by the BIST circuit 110 (FIG. 10) for the quality management unit 104 (FIG. 10) in the Ising chip 100 (FIG. 10) according to the present embodiment, which has received a test start signal from the tester 120 connected via the connection cable 121 as shown in FIG. 21.

After receiving the test start signal, the BIST circuit 110 starts the quality test processing as illustrated in FIG. 20 and firstly executes step SP50 and step SP51 in the same manner as in step SP20 and step SP21 of the quality test processing according to the second embodiment as described earlier with reference to FIG. 15.

Then, if the BIST circuit 110 obtains an affirmative result in the determining in step SP51, it selects one defective memory cell from among the defective memory cells detected by the memory cell test in step SP50 (SP52) and determines whether or not that defective memory cell is any of the memory cell N retaining the spin value or the memory cell IU0, IU1, IL0, IL1, IR0, IR1, ID0, ID1, IF0, IF1, IB0, or IB1 for retaining the interaction coefficient (SP53).

If the BIST circuit 110 obtains an affirmative result in this determining and only when the defective memory cell selected in step SP52 is the memory cell retaining the interaction coefficient, the BIST circuit 110 determines whether or not the number of the defective memory cell pairs is equal to or less than the number of the redundant memory cell pairs IBx provided in that spin unit 103 in the defective spin unit 73 including the defective memory cell (SP54).

Then, the BIST circuit 110 executes the processing from step SP55 to step SP65 in the same manner as from step SP25 to step SP35 of the quality test processing according to the second embodiment described earlier and then terminates this quality test processing.

Accordingly, the present embodiment is designed as described above so that the redundant memory cell NB associated with the memory cell N retaining the spin value is provided in the spin unit 103; and when a defect in the memory cell N is detected by the memory cell test, the second switching circuit 105 is switched to use the redundant memory cell NB instead of the memory cell N. So, in addition to the same advantageous effects as those obtained in the first and second embodiments, it is possible to obtain the advantageous effect of being capable of using the spin unit 103 even when the memory cell N retaining the spin value is defective.

(4) Other Embodiments

It should be noted that the aforementioned first to third embodiments have described the case where the present invention is applied to the Ising chip 8 which simulates interactions between spins in the Ising model; however, the present invention is not limited to this example and can be applied to a wide variety of semiconductor devices which simulate interactions between nodes in interaction models other than the Ising model. Such a semiconductor device can be configured in the same manner as the Ising chips 8, 70 and 100 according to the first to third embodiments described above with reference to FIG. 1 to FIG. 20B. In this case, if there is no bias for each node, a memory cell pair ISx which retains a coefficient of that bias (hereinafter referred to as the bias coefficient) can be omitted from element units; and if such a bias exists, such a bias coefficient, instead of the external magnetic field coefficient, may be retained in the memory cell pair ISx.

Furthermore, the aforementioned first to third embodiments have described the case where the random number generator is provided in each Ising chip 8, 70 and 100; however, the present invention is not limited to this example and the random number generator may be provided outside the Ising chip 8, 70 and 100.

The aforementioned first to third embodiments have described the case where when a defective memory cell(s) is detected by the quality test, the value "0" is stored in memory cells corresponding to other spin units 32 influenced by a defective spin unit 32 including that defective memory cell (the first embodiment), or it is switched to the second switching circuit 80 or the redundant memory cell pair switching circuit 81 is switched so as to sequentially switch the defective memory cell and its subsequent memory cell pairs to their adjacent memory cell pairs (the redundant memory cell pair) (the second embodiment), or the third switching circuit 105 so as to replace the memory cell N retaining the spin value with the redundant memory cell NB; however, the present invention is not limited to this example and, for example, the Ising chip 8, 70 and 110 in which a defective memory cell(s) has been detected may not be used.

Furthermore, the aforementioned first to third embodiments have described the case where the quality management unit 11, 74 and 104 (FIG. 2 and FIG. 10) is provided in the Ising chip 8, 70 and 100 (FIG. 2 and FIG. 10); however, the present invention is not limited to this example and external equipment may have the function of these quality management units 11, 74 and 104. For example, the tester 120 may be equipped with the same function as that of these quality management units 11, 74 and 104 as illustrated in FIG. 21 and the tester 120 may execute part of the quality test processing described earlier with reference to FIG. 9, FIG. 15, or FIG. 20 and the pre-interaction processing described earlier with reference to FIG. 16.

Figure 22:
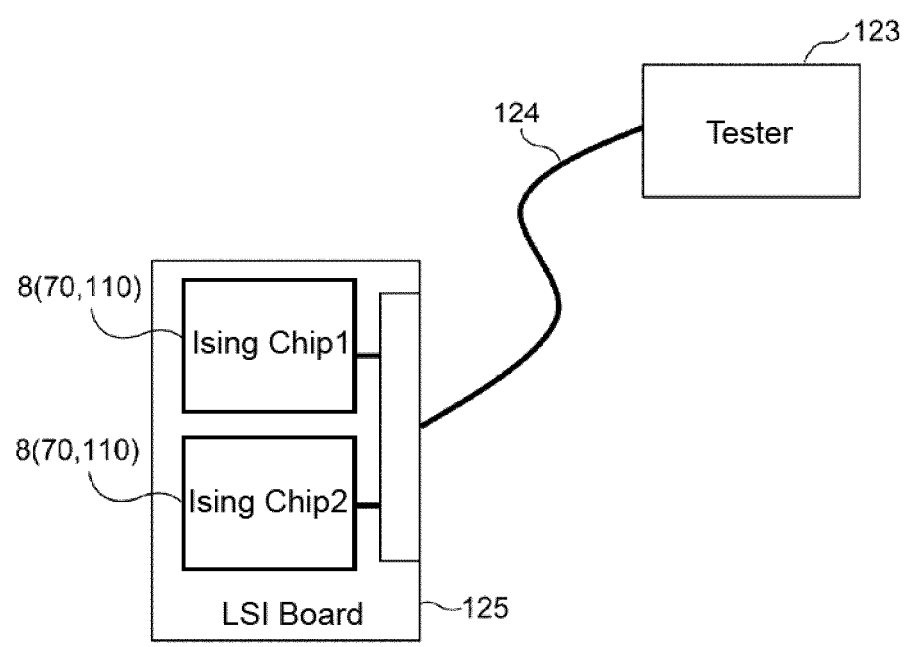
FIG. 22 is a schematic diagram for explaining another embodiment.

Furthermore, the aforementioned first to third embodiments have described the case where one Ising chip 8, 70 and 110 is mounted on one LSI board 122 as illustrated in FIG. 21; however, the present invention is not limited to this example and the present invention can be applied to a case where, for example, a plurality of Ising chips 8, 70 and 100 are formed on an LSI board 125 as shown in FIG. 22. In this case, a tester 123 having such a function may be connected via a connection cable 124 to the LSI board 125 and the tester 123 may be used to execute part of the quality test and the pre-interaction processing concurrently or sequentially on the respective Ising chips 8, 70 and 100 on the LSI board 125.

Furthermore, the aforementioned second and third embodiments have described the case where the address of the first or second switching circuit 80, 105 associated with the defective memory cell pair composed of the defective memory cell is reported as the switching address, which is recognized as the first information about the defective memory cell detected by the quality test, to the relevant spin unit 73 and 103; however, the present invention is not limited to this example and the address of the defective memory cell may be directly reported to the spin unit 73 and 103 and that spin unit 73 and 103 may identify the relevant first or second switching circuit 80, 105 based on the address of the defective memory cell and switch a connection destination of that first or second switching circuit 80, 105.

INDUSTRIAL AVAILABILITY

The present invention can be applied to a wide variety of semiconductor devices representing interaction models.

REFERENCE SIGNS LIST

1 information processing unit; 3 CPU; 7 Ising chip controller; 8, 70 and 100 Ising chip; 10, 101 subarray; 11, 74 and 104 quality management unit; 20, 72, 102 spin unit group; 21 control decoder; 22 word line driver; 23 local I/O circuit; 32, 73 and 103 spin unit; 60, 90, 110 BIST circuit; 61, 91 fail address memory; 62 coefficient setting circuit; 80 first switching circuit; 80A, 105A normally-closed terminal; 80B, 105B normally-open terminal; 81 redundant memory cell pair switching circuit; 82 switching address memory; 92, 111 switching address generation circuit; 105 second switching circuit; 120, 123 tester; 121, 125 connection cable; and N, NB, IS0, IS1, IU0, IU1, IL0, IL1, IR0, IR1, ID0, ID1, IF0, IF1, IB0, IB1 memory cells.

What is claimed is:

1. A semiconductor device simulating interactions between nodes in an interaction model, the semiconductor device comprising:
   a plurality of element units, each of which is provided corresponding to each of the nodes constituting the interaction model; and
   a quality management unit that manages quality of each of the element units;
   wherein each element unit includes:
      a first memory cell that retains a value indicating a state of the node associated with the element unit;
      one or more second memory cells, each of which retains each interaction coefficient with each of the other nodes causing an interaction with a relevant node; and
      a logical circuit that determines a value indicating a next state of the node associated with the element unit based on the interaction coefficient retained in each of the second memory cells and a value which is given from each of the other corresponding element units and indicates the state of each of the other nodes causing an interaction over the node associated with the element unit;
   wherein the quality management unit:
      executes a specified quality test for each of the element units;

compares test results of the quality test with pre-given results to be obtained from the quality test; and detects, based on comparison results, a defective memory cell among the first or second memory cells, and a defective element unit, wherein the element unit includes a third memory cell which is redundant;

wherein the quality management unit sends first information regarding a defective second memory cell detected in the quality test to the element unit including the second memory cell, wherein the element unit which has received the first information switches a corresponding relationship between the second and third memory cells and a value, which is given from each of the other corresponding unit elements and indicates the state of each of the other nodes causing the interaction over the node associated with the relevant element unit, based on the first information in order to use the third memory cell instead of the defective second memory cell.

2. The semiconductor device according to claim 1, wherein the quality test includes:

a memory cell test to write/read a specified value to or from each of the first and second memory cells of each element unit; and an interaction test to respectively set the value indicating the state of the relevant node and each interaction coefficient, respectively have each element unit execute interaction operation in a specified pattern to each element unit, and compare results of the interaction operation with pre-given results to be obtained through the interaction operation.

3. The semiconductor device according to claim 1, wherein the quality management unit sets a specified value to the second memory cell, which retains the interaction coefficient corresponding to the node, in each of the other element units which inputs the value, which indicates the state of the node and is output from the defective element unit which includes the defective second memory cell, based on the test results of the quality test.

4. The semiconductor device according to claim 1, wherein the element unit includes a first switching circuit provided corresponding to each of the second memory cells; and wherein in the element unit which has received the first information from the quality management unit, the first switching circuit which is necessary switches a corresponding memory cell of a value, which is given from the other element units and indicates the state of each of the other nodes causing the interaction over the node associated with the element unit, from the second memory cell currently used, to another predetermined second memory cell based on the first information.

5. The semiconductor device according to claim 1, wherein the element unit includes:

a redundant fourth memory cell provided corresponding to the first memory cell; and a second switching circuit, which is provided corresponding to the first memory cell and outputs, to another element unit, a value retained by the first memory cell and indicating the state of the node;

wherein the fourth memory cell retains a value which is determined by the logical circuit and is the same as the value which is retained by the first memory cell and indicates the state of the node;

wherein the quality management unit sends second information regarding the defective first memory cell detected by the quality test, to the element unit including the first memory cell;

wherein the element unit which has received the second information switches the value, which indicates the state of the node and is to be output to another element unit, from the value which indicates the state of the node and is retained by the first memory cell, to the value which indicates the state of the node and is retained by the fourth memory cell, based on the second information.

6. A quality management method for a semiconductor device simulating interactions between nodes in an interaction model, the semiconductor device comprising:

a plurality of element units, each of which is provided corresponding to each of the nodes constituting the interaction model; and a quality management unit which manages quality of each of the element units;

wherein each element unit includes:

a first memory cell that retains a value indicating a state of the node associated with the element unit;

one or more second memory cells, each of which retains each interaction coefficient with each of the other nodes causing an interaction with a relevant node; and a logical circuit that determines a value indicating a next state of the node associated with the element unit, based on the interaction coefficient retained in each of the second memory cells and a value which is given from each of the other corresponding element units and indicates the state of each of the other nodes causing an interaction over the node associated with the element unit;

wherein the quality management method comprises:

a first step of executing, by the quality management unit including a circuit, a specified quality test for each of the element units;

a second step of comparing, by the quality management unit, test results of the quality test with pre-given results to be obtained from the quality test; and a third step of detecting, based on comparison results, a detective memory cell among the first or second memory cells, and a defective element unit, wherein the element unit includes a third memory cell which is redundant;

wherein the quality management method further comprises:

a fourth step of sending, by the quality management unit, first information regarding the defective second memory cell detected in the quality test, to the element unit having the second memory cell; and a fifth step of switching, by the element unit which has received the first information a corresponding relationship between the second and third memory cells and the value, which is given from each of the other corresponding unit elements and indicates the state of each of the other nodes causing an interaction over the node associated with the relevant element unit, based on the first information in order to use the third memory cell instead of the defective second memory cell.

7. The quality management method for the semiconductor device according to claim 6, wherein the quality test includes:

a memory cell test to write/read a specified value to or from each of the first and second memory cells for each element unit; and an interaction test to respectively set the value indicating the state of the relevant node and each interaction coefficient in a specified pattern to each element unit, have each element unit execute interaction operation, and compare results of the interaction operation with pre-given results to be obtained through the interaction operation.

8. The quality management method for the semiconductor device according to claim 6, the quality management method further comprising a fourth step whereby the quality management unit sets a specified value to the second memory cell, which retains the interaction coefficient corresponding to the node in each of the other element units that inputs a value indicating the state of the node and output from the defective element unit and includes the defective second memory cell, based on the test results of the quality test.

9. The quality management method for the semiconductor device according to claim 6, wherein the element unit includes a first switching circuit provided corresponding to each of the second memory cells;
   wherein in the fifth step, in the element unit which has received the first information from the quality management unit, the first switching circuit which is necessary switches a corresponding memory cell of the value which is given from the other element units and indicates the state of each of the other nodes causing an interaction over the node associated with the relevant element unit, from the second memory cells currently used, to another predetermined second memory cell based on the first information.

10. The quality management method for the semiconductor device according to claim 6, wherein the element unit includes:
   a fourth memory cell provided corresponding to the first memory cell and is redundant; and
   a second switching circuit, which is provided corresponding to the first memory cell and outputs, to another element unit, a value retained by the first memory cell and indicating the state of the node;
   wherein the fourth memory cell retains a value which is determined by the logical circuit and is the same as the value which is retained by the first memory cell and indicates the state of the node;
   wherein in the fourth step, the quality management unit sends second information regarding the defective first memory cell detected by the quality test, to the element unit including the first memory cell; and
   wherein in the fifth step, the element unit which has received the second information switches the value, which indicates the state of the node and is to be output to another element unit, from the value which indicates the state of the node retained by the first memory cell, to the value which indicates the state of the node and is retained by the fourth memory cell, based on the second information.

* * * * *